United States Patent
Chen et al.

(10) Patent No.: US 12,316,348 B2
(45) Date of Patent: May 27, 2025

(54) POLAR CODE SEGMENT ENCODING METHOD AND RELATED APPARATUS

(71) Applicant: HUAWEI TECHNOLOGIES CO., LTD., Guangdong (CN)

(72) Inventors: Yan Chen, Shanghai (CN); Guanjun Ni, Shanghai (CN); Yuhong Zhu, Shanghai (CN); Bingguang Peng, Shanghai (CN); Shangbang Sun, Shanghai (CN); Jingjing Yao, Shanghai (CN); Rong Wang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/552,626

(22) PCT Filed: Mar. 28, 2022

(86) PCT No.: PCT/CN2022/083380
§ 371 (c)(1),
(2) Date: Sep. 26, 2023

(87) PCT Pub. No.: WO2022/206675
PCT Pub. Date: Oct. 6, 2022

(65) Prior Publication Data
US 2024/0214005 A1    Jun. 27, 2024

(30) Foreign Application Priority Data
Mar. 31, 2021    (CN) .......................... 202110344923.9

(51) Int. Cl.
*H03M 13/13*    (2006.01)
*H03M 13/00*    (2006.01)

(52) U.S. Cl.
CPC ......... *H03M 13/13* (2013.01); *H03M 13/611* (2013.01)

(58) Field of Classification Search
CPC .... H03M 13/13; H03M 13/611; H03M 13/00; H03M 13/09; H03M 13/618; H03M 13/6362; H04L 1/00
See application file for complete search history.

(56) References Cited

U.S. PATENT DOCUMENTS

2020/0235847 A1*  7/2020  Wang ................... H04L 1/0061
2020/0321982 A1*  10/2020  Kamiya ............ H03M 13/6516

FOREIGN PATENT DOCUMENTS

CN    112583522 A    3/2021

OTHER PUBLICATIONS

International Search Report and Written Opinion in International Appln. No. PCT/CN2022/083380, mailed on Jun. 28, 1 2022, 17 pages (with English translation).

* cited by examiner

*Primary Examiner* — Thien Nguyen
(74) *Attorney, Agent, or Firm* — Fish & Richardson P.C.

(57) ABSTRACT

A polar code segment encoding method and a related apparatus are disclosed, and the method includes: determining, based on an information bit quantity of a first information bit sequence and a first code rate, a target code length for polar code encoding; determining an initial code length based on the target code length, where the initial code length is an integer multiple of a smallest segment code length; dividing the first information bit sequence into S segments of information bit sequences based on the first code rate and the initial code length and when the initial code length is different from the target code length, performing rate matching on the S segments in a process of performing polar code encoding on the S segments of information bit sequences, where a sum of segment code lengths of the S segments is the target code length after the rate matching.

20 Claims, 6 Drawing Sheets

S201: Determine, based on an information bit quantity of a first information bit sequence and a first code rate, an initial code length and a target code length for encoding S202: Divide, based on the first code rate and the initial code length, mother code corresponding to the first information bit sequence into S segments, where a segment code length of an $i^{th}$ segment in the S segments is greater than or equal to a segment code length of an $(i+1)^{th}$ segment in the S segments, and a segment code length of an $S^{th}$ segment in the S segments is less than a largest segment code length S203: Determine a target information bit quantity of each segment based on segment code lengths of the S segments and the first code rate, and divide the first information bit sequence into S segments of information bit sequences based on the target information bit quantity of each segment S204: Perform polar code encoding on the S segments of information bit sequences based on a segment code length corresponding to each segment of information bit sequence; and when the initial code length is different from the target code length, perform rate matching on the S segments in a polar code encoding process based on the first code rate and the segment code lengths of the S segments, where a code length of the mother code corresponding to the first information bit sequence is the target code length after the rate matching

FIG. 3

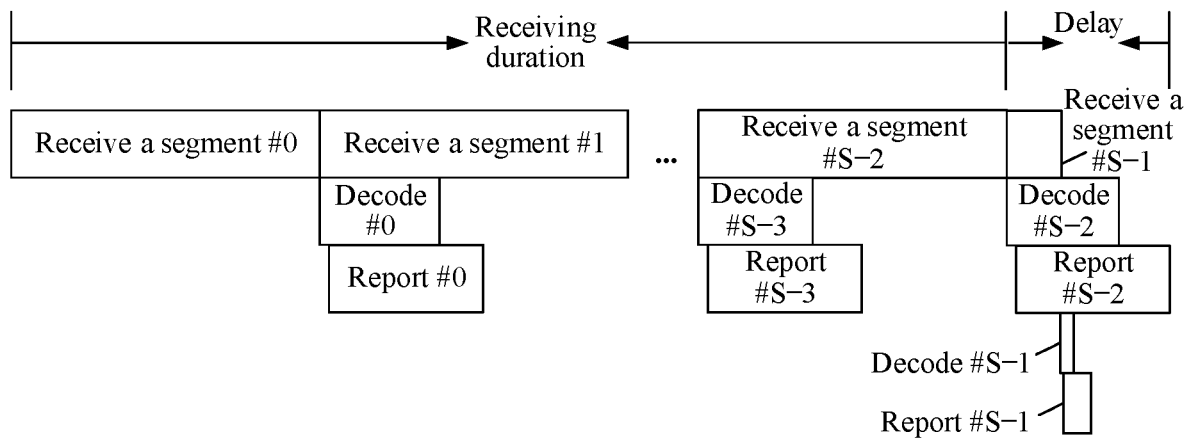

FIG. 4

POLAR CODE SEGMENT ENCODING METHOD AND RELATED APPARATUS

CROSS-REFERENCE TO RELATED APPLICATIONS

This application is a National Stage of International Application No. PCT/CN2022/083380, filed on Mar. 28, 2022, which claims priority to Chinese Patent Application No. 202110344923.9, filed on Mar. 31, 2021, both of which are hereby incorporated by reference in their entireties.

TECHNICAL FIELD

This application relates to the field of electronic technologies, and in particular, to a polar code segment encoding method and a related apparatus.

BACKGROUND

As a user experience requirement increases, a terminal device also has an increasingly high requirement on a low delay of a Bluetooth system. In addition, a requirement on low power consumption of the Bluetooth system also brings a greater challenge to implementing a low-delay Bluetooth system.

Currently, a Bluetooth system usually uses an encoding manner in which convolutional code is used, and a decoding algorithm of the convolutional code is a Viterbi decoding algorithm with traceback. The current encoding manner in which the convolutional code is used cannot further improve system performance of the Bluetooth system while meeting the increasingly high requirement on a low delay.

SUMMARY

Embodiments of this application provide a polar code segment encoding method and a related apparatus, which effectively improves system performance while meeting a requirement on a low delay.

According to a first aspect, this application provides a polar code segment encoding method, including: determining, based on an information bit quantity of a first information bit sequence and a first code rate, a target code length for polar code encoding, and determining an initial code length based on the target code length, where the initial code length is an integer multiple of a smallest segment code length; dividing the first information bit sequence into S segments of information bit sequences based on the first code rate and the initial code length, where the S segments of information bit sequences respectively correspond to S encoded segments, where a segment code length of an $i^{th}$ segment in the S segments is greater than or equal to a segment code length of an $(i+1)^{th}$ segment in the S segments, a segment code length of an $S^{th}$ segment in the S segments is less than a largest segment code length, a sum of segment code lengths of the S segments is equal to the initial code length, and a segment code length of a segment is a power of 2; and when the initial code length is different from the target code length, performing rate matching on the S segments in a process of performing polar code encoding on the S segments of information bit sequences, where the sum of the segment code lengths of the S segments is the target code length after the rate matching.

In this embodiment of this application, before the polar code segment encoding is performed on the first information bit sequence, a segment code length of a segment obtained by encoding each segment of information bit sequence after the first information bit sequence is segmented is first determined, so that a segment code length of a last segment is less than the largest segment code length. In addition, the rate matching is performed in a segment encoding process, so that a total code length of the first information bit sequence after the encoding is equal to the target code length. In this way, a decoding delay and encoding performance can be effectively balanced, to be specific, system performance can be effectively improved while a requirement on a low delay is met.

In an implementation, the smallest segment code length is $2^a$, the largest segment code length is $2^b$, a $c^{th}$ segment code length in b−a+1 segment code lengths is $2^c$, a, b, and c are positive integers, and a≤c≤b. The dividing the first information bit sequence into S segments of information bit sequences based on the first code rate and the initial code length, where the S segments of information bit sequences respectively correspond to S encoded segments includes: dividing the initial code length into the S segments based on the first code rate: determining a target information bit quantity of each of the S segments based on the segment code lengths of the S segments: and dividing the first information bit sequence into the S segments of information bit sequences based on the target information bit quantity of each segment.

In an implementation, the target code length N2 corresponding to the first information bit sequence is ceil($K_0$/R), where $K_0$ represents the information bit quantity of the first information bit sequence, and R represents the first code rate.

In an implementation, a value of the initial code length N1 is ceil(N2/$2^b$)*$2^b$, the initial code length is an integer multiple of the largest segment code length, and ceil(x) indicates to round up x; or a value of the initial code length N1 is ceil(N2/$2^a$)*$2^a$.

It may be understood that the segment code lengths each are a power of 2. To enable the segment code length of each segment to meet the power of 2, the sum of the segment code lengths of the S segments (that is, the initial code length) may be the integer multiple of the smallest segment code length, or may be the integer multiple of the largest segment code length.

In an implementation, the performing rate matching on the S segments in a process of performing polar code encoding on the S segments of information bit sequences, where the sum of the segment code lengths of the S segments is the target code length after the rate matching includes: when the target code length is less than the initial code length, in the process of performing polar code encoding on the S segments of information bit sequences, separately performing rate matching on the S segments by puncturing and/or shortening; or when the target code length is greater than the initial code length, in the process of performing polar code encoding on the S segments of information bit sequences, separately performing rate matching on the S segments by adding a redundant bit at a preset location of the S segments, where a total bit quantity for the rate matching of the S segments is a first bit quantity, and the first bit quantity is a difference between the initial code length and the target code length.

In this embodiment of this application, when the initial code length is different from the target code length, in the segment encoding process, the rate matching is performed on the S segments, and a total code length corresponding to the S segments after the rate matching is the target code length, so that a total code rate of the first information bit sequence after the encoding is a preset first code rate.

In an implementation, the performing rate matching on the S segments in a process of performing polar code encoding on the S segments of information bit sequences, where the sum of the segment code lengths of the S segments is the target code length after the rate matching includes: determining, based on a segment code length of a first segment in the S segments, an initial bit quantity for rate matching of the first segment; and determining that a bit quantity for the rate matching of the first segment is a sum of an adjusted bit quantity of the first segment and a result of rounding down or rounding up the initial bit quantity of the first segment, where the adjusted bit quantity of the first segment is determined based on a difference between the first bit quantity and a sum of values obtained by rounding off initial bit quantities of the S segments.

In an implementation, the segment code length of the first segment is $2^c$, and $a \leq c \leq b$. The determining, based on a segment code length of a first segment in the S segments, an initial bit quantity for rate matching of the first segment includes: determining, based on a proportion of the segment code length of the first segment in the initial code length, that the initial bit quantity required for the rate matching of the first segment is $2^c/N1*|N1-N2|$.

In an implementation, the $b-a+1$ segment code lengths each correspond to a second weight factor for rate matching, and the segment code length of the first segment is $2^c$, and $a \leq c \leq b$. The determining, based on a segment code length of a first segment in the S segments, an initial bit quantity for rate matching of the first segment includes: determining that the initial bit quantity for the rate matching of the first segment is $h_c*x$, where $h_c$ represents a second weight factor corresponding to the segment code length of $2^c$, and a sum of the initial bit quantities for the rate matching of the S segments is equal to the first bit quantity.

In an implementation, when the target code length is less than the initial code length, a smaller segment code length indicates a smaller second weight factor corresponding to the segment code length: or when the target code length is greater than the initial code length, a smaller segment code length indicates a larger second weight factor corresponding to the segment code length.

It should be noted that, a second weight factor corresponding to a segment having a smaller segment code length is smaller, so that a bit quantity for puncturing and/or shortening of the segment having a smaller segment code length is smaller. In an implementation, a ratio of a second weight factor corresponding to a segment code length of $2^{c+1}$ to the second weight factor corresponding to the segment code length of $2^c$ is greater than 2, so that an increase amplitude of a code rate of a segment having a large code length is large, and an increase amplitude of a code rate of a segment having a small code length is small, to effectively balance encoding performance of different segments.

In an implementation, the largest segment code length in the segment code lengths of the S segments is $2^r$, $a \leq r \leq b$, a quantity of segments having the segment code length of $2^r$ in the S segments is $M_r$, and a bit quantity for rate matching of a segment having a segment code length less than $2^r$ in the S segments is 0. The determining, based on a segment code length of a first segment in the S segments, an initial bit quantity for rate matching of the first segment includes: determining that the initial bit quantity for the rate matching of the first segment in the $M_r$ segments having the segment code length of $2^r$ in the S segments is $|N1-N2|/M_r$.

In an implementation, the determining, based on a segment code length of a first segment in the S segments, an initial bit quantity for rate matching of the first segment includes: determining that the initial bit quantity for the rate matching of the first segment in the S segments is $|N1-N2|/S$.

In an implementation, the dividing the initial code length into the S segments based on the first code rate includes: determining, based on the initial code length and the $b-a+1$ segment code lengths, a quantity of segments corresponding to each of the $b-a+1$ segment code lengths; and dividing the initial code length into the S segments based on the quantity of segments corresponding to each of the $b-a+1$ segment code lengths, where the segment code length of the $i^{th}$ segment in the S segments is greater than or equal to the segment code length of the $(i+1)^{th}$ segment in the S segments, and the segment code length of the $S^{th}$ segment in the S segments is less than the largest segment code length.

In this embodiment of this application, to control an overall decoding delay of mother code after the first information bit sequence is encoded, in this embodiment of this application, a segment code length of a segment obtained by encoding each segment of information bit sequence is first determined, so that segment code lengths of segments in the mother code are in a descending trend. To be specific, an initial code length of the mother code is first divided into S segments, and then the first information bit sequence is divided into S segments of information bit sequences based on segment code lengths of the S segments. According to this embodiment of this application, system performance can be effectively improved while a requirement on a decoding delay is ensured.

In an implementation, the determining, based on the initial code length and the $b-a+1$ segment code lengths, a quantity of segments corresponding to each of the $b-a+1$ segment code lengths includes: determining a quantity F1 of segments having the largest segment code length based on the initial code length and the largest segment code length of $2^{\wedge b}$; and decomposing, into at least one non-largest segment code length, a first remaining code length obtained by removing F1 largest segment code lengths from the initial code length, and determining a quantity of segments corresponding to each of the at least one non-largest segment code length, where the non-largest segment code length is a segment code length less than $2^{\wedge b}$.

In an implementation, when the initial code length is the integer multiple of the largest segment code length, a value of F1 is $N1/2^{\wedge b}$; or when the initial code length is not the integer multiple of the largest segment code length, the value of F1 is floor($N1/2^{\wedge b}$), and floor(x) indicates to round down x.

In an implementation, the determining, based on the initial code length and the $b-a+1$ segment code lengths, a quantity of segments corresponding to each of the $b-a+1$ segment code lengths includes: determining, based on the initial code length and the $b-a+1$ segment code lengths, a quantity of reserved segments corresponding to each of the $b-a+1$ segment code lengths; determining, based on the quantity of reserved segments corresponding to each segment code length, a reserved code length corresponding to the initial code length; determining, based on the initial code length, the reserved code length, and the quantity of reserved segments corresponding to each segment code length, a quantity of remaining segments corresponding to each segment code length; and determining that the quantity of segments corresponding to each segment code length is a sum of the quantity of reserved segments corresponding to each segment code length and the quantity of remaining segments corresponding to each segment code length.

In an implementation, the determining a target information bit quantity of each of the S segments based on the segment code lengths of the S segments includes: decomposing, in a decomposition manner agreed in a protocol, the information bit quantity of the first information bit sequence into $$\sum_{c=a}^{b} M_c * K_c,$$

where $M_c$ represents a quantity of segments having the segment code length of $2^c$ in the S segments, $K_c$ represents a target information bit quantity of the segment having the segment code length of $2^c$ in the S segments, $K_c < 2^c$, and $a \leq c \leq b$.

In an implementation, the determining a target information bit quantity of each of the S segments based on the segment code lengths of the S segments includes: determining, based on the first code rate and the b−a+1 segment code lengths, that a reference information bit quantity of a segment having the segment code length of $2^c$ in the S segments is ceil($2^{\wedge c}*R$) or floor($2^{\wedge}*R$), where $a \leq c \leq b$; and determining the target information bit quantity of each of the S segments based on a reference information bit quantity of each of the S segments and a first redundant bit quantity, where a sum of target information bit quantities of the S segments is the information bit quantity $K_0$ of the first information bit sequence, and the first redundant bit quantity is obtained by subtracting $K_0$ from a sum of parameter information bit quantities of the S segments.

In an implementation, the determining the target information bit quantity of each of the S segments based on a reference information bit quantity of each of the S segments and a first redundant bit quantity includes: determining that a target information bit quantity of the $i^{th}$ segment in the S segments is obtained by subtracting the first redundant bit quantity from a parameter information bit quantity of the $i^{th}$ segment, where a target information bit quantity of a second segment other than the $i^{th}$ segment in the S segments is a parameter information bit quantity of the second segment, and $1 \leq i \leq S$.

In an implementation, a value of i is S.

In an implementation, the largest segment code length of the S segments is $2^r$, and a quantity of segments having the segment code length of $2^r$ in the S segments is $M_r$, and $a \leq r \leq b$. The determining the target information bit quantity of each of the S segments based on a reference information bit quantity of each of the S segments and a first redundant bit quantity includes: determining that a target information bit quantity of the segment having the segment code length of $2^r$ in the S segments is a parameter information bit quantity of the segment having the segment code length of $2^r$; and allocating the first redundant information bit quantity to target information bit quantities of $S-M_r$ segments having segment code lengths less than $2^b$ in the S segments, and determining that a target information bit quantity of a second segment in the $S-M_r$ segments having the segment code lengths less than $2^b$ is obtained by subtracting an allocated redundant information bit quantity from a parameter information bit quantity of the second segment.

In an implementation, the determining the target information bit quantity of each of the S segments based on a reference information bit quantity of each of the S segments and a first redundant bit quantity includes: when the first redundant information bit quantity is less than the segment code length of the $S^{th}$ segment in the S segments, determining that a target information bit quantity of the $S^{th}$ segment is obtained by subtracting the first redundant information bits from a reference information bit quantity of the $S^{th}$ segment, where target information bit quantities of first S−1 segments in the S segments are reference information bit quantities of the first S−1 segments; or when the first redundant information bit quantity is greater than or equal to a sum of reference information bit quantities of last j segments in the S segments, and is less than a sum of reference information bit quantities of last j+1 segments in the S segments, allocating the first redundant information bit quantity to the last j segments, and determining that target information bit quantities of the last j segments are obtained by subtracting allocated redundant information bit quantities from parameter information bit quantities of the last j segments, where target information bit quantities of first S−j segments in the S segments are reference information bit quantities of the first S−j segments.

In an implementation, a segment having a smaller segment code length is allocated with a larger redundant information bit quantity.

In an implementation, the determining, based on the initial code length, a quantity of reserved segments corresponding to each of the b−a+1 segment code lengths includes: sequentially determining, based on the initial code length and the b−a+1 segment code lengths and in ascending order of the segment code lengths, quantities of reserved segments respectively corresponding to the b−a+1 segment code lengths.

In this embodiment of this application, to implement that the segment code lengths of the S segments are in a descending trend, to be specific, a segment code length of a $(j+1)^{th}$ segment in the S segments is less than or equal to a segment code length of a $j^{th}$ segment, after the initial code length is determined, a specific quantity of segments may be reserved in advance for a small segment code length. It may be understood that a specific quantity of segments is preferentially reserved for a small segment code length, so that it can be ensured that a segment code length of a tail segment of the mother code after the first information bit sequence is encoded is less than the largest segment code length.

In an implementation, the determining, based on the initial code length, a quantity of reserved segments corresponding to each of the b−a+1 segment code lengths includes: when $N1 < p*2^{\wedge a}$, determining that a quantity of reserved segments corresponding to the segment code length of $2^{\wedge a}$ is $$\text{floor}\left(\frac{N1}{2^{\wedge a}}\right),$$

and a quantity of reserved segments corresponding to a segment code length of $2^{\wedge j}$ is 0, where $a < j < b$; when $$p * \sum_{i=a}^{c} 2^{\wedge i} \leq N1 < p * \sum_{i=a}^{c+1} 2^{\wedge i},$$

determining that the quantity of reserved segments corresponding to the segment code length of $2^{\wedge j}$ is 0, a quantity of reserved segments corresponding to a segment code length of $2^{\wedge c+1}$ is $$\text{floor}\left(\frac{N1 - p * \sum_{i=a}^{c} 2^{\wedge i}}{2^{\wedge c+1}}\right),$$

and a quantity of reserved segments corresponding to a segment code length of $2^{\wedge v}$ is P, where $a \leq c \leq b-1$, $a \leq v \leq c$, and $c+1 < j \leq b$; or when $$p * \sum_{i=a}^{b} 2^{\wedge i} \leq N1,$$

determining that the quantity of reserved segments corresponding to each segment code length is P.

In this embodiment of this application, a value of P may be determined based on an actual situation, and a lower reporting rate relative to a receiving rate indicates a larger value of P.

In an implementation, the determining, based on the initial code length, the reserved code length, and the quantity of reserved segments corresponding to each segment code length, a quantity of remaining segments corresponding to each segment code length includes: obtaining a second remaining code length by subtracting the reserved code length from the initial code length; and sequentially determining, based on the second remaining code length and in descending order of the segment code lengths, quantities of remaining segments respectively corresponding to the b−a+1 segment code lengths It should be noted that, a larger segment code length indicates a better encoding gain and a better error correction capability. In this embodiment of this application, to reduce a decoding delay limit as much as possible, a quantity of segments may be first reserved for a segment having a small segment code length. When the decoding delay limit is met, the foregoing remaining code length is preferentially allocated to a segment having a large segment code length, to improve overall encoding performance of encoding the first information sequence.

In an implementation, the determining, based on the initial code length, the reserved code length, and the quantity of reserved segments corresponding to each segment code length, a quantity of remaining segments corresponding to each segment code length includes: when $N1 < 2^{\wedge a}$, determining that a quantity $z_c$ of remaining segments corresponding to the segment code length of $2^{\wedge c}$ is 0, and a quantity $z_a$ of remaining segments corresponding to the segment code length of $2^{\wedge a}$ is 1, where $a < c \leq b$; or when $N1 \geq 2^{\wedge a}$, sequentially determining, in descending order of the segment code lengths, quantities of remaining segments respectively corresponding to the segment code lengths, where a quantity $z_b$ of remaining segments corresponding to the segment code length of $2^{\wedge b}$ is $$\text{floor}\left(\frac{N1 - N_{res}}{2^{\wedge b}}\right),$$

the quantity $z_c$ of remaining segments corresponding to the segment code length of $2^{\wedge c}$ is $$\text{floor}\left(\frac{N1 - N_{res} - \sum_{e=c+1}^{b} z_e * 2^{\wedge e}}{2^{\wedge c}}\right), a \leq c < b,$$

and $N_{res}$ represents the second remaining code length.

In an implementation, a value of P is 1 or 2.

In an implementation, before the determining, based on an information bit quantity of a first information bit sequence and a first code rate, a target code length for polar code encoding, the method further includes: establishing, by a transmit end device, a Bluetooth connection to a receive end device. After the dividing the first information bit sequence into S segments of information bit sequences based on the first code rate and the initial code length, the method further includes: performing, by the transmit end device, based on a target information bit quantity of an $i^{th}$ segment of information bit sequence in the S segments of information bit sequences and a segment code length of a segment corresponding to the $i^{th}$ segment of information bit sequence, polar code encoding on the $i^{th}$ segment of information bit sequence, where i is a positive integer less than S; and sending, by the transmit end device to the receive end device through a Bluetooth channel, information obtained after the $i^{th}$ segment of information bit sequence is encoded.

According to a second aspect, an electronic device is provided and includes: a communication interface, a memory, and a processor. The communication interface and the memory are coupled to the processor, the memory is configured to store computer program code, and the computer program code includes computer instructions. When the processor reads the computer instructions from the memory, the electronic device is enabled to perform any one of the possible implementations of the first aspect.

According to a third aspect, this application provides a communication chip, where the communication chip may include: a processor and one or more interfaces coupled to the processor. The processor may be configured to invoke, from a memory, a part or all of implementation programs of the polar code segment encoding method provided in the first aspect, and execute instructions included in the part or all of the implementation programs. The interface may be configured to output a data processing result of the processor.

According to a fourth aspect, a computer-readable storage medium is provided and includes instructions. When the instructions are run on an electronic device, the electronic device is enabled to perform any one of the possible implementations of the first aspect.

According to a fifth aspect, a computer product is provided. When the computer program product runs on a computer, the computer is enabled to perform any one of the possible implementations of the first aspect.

BRIEF DESCRIPTION OF DRAWINGS

FIG. 3 is a schematic flowchart of a polar code segment encoding method according to an embodiment of this application;

FIG. 4 is a schematic diagram of another decoding delay according to an embodiment of this application;

DESCRIPTION OF EMBODIMENTS

The following clearly and completely describes technical solutions in embodiments of this application with reference to accompanying drawings. In the descriptions of embodiments this application, unless otherwise stated. "/" means "or". For example. A/B may represent A or B. "And/or" in this specification describes only an association relationship for describing associated objects and represents that three relationships may exist. For example. A and/or B may represent three cases: Only A exists, both A and B exist, and only B exists. In addition, in the descriptions of embodiments of this application, "a plurality of" refers to two or more than two.

Terms "first" and "second" are merely intended for a purpose of description, and shall not be understood as an indication or implication of relative importance or implicit indication of a quantity of indicated technical features. Therefore, features limited by "first" or "second" may explicitly or implicitly include one or more features. In the descriptions of embodiments of this application, unless otherwise stated, "a plurality of" means two or more than two.

A Bluetooth communication technology is an open global specification for wireless data and voice communication, which is based on a low-cost short-distance wireless connection, and is a special short-distance wireless connection technology for establishing a communication environment for fixed and mobile devices. The Bluetooth communication technology has technical features such as low costs, low power consumption, short-distance communication, high frequency (a frequency hopping technology), and good confidentiality.

Figure 1:
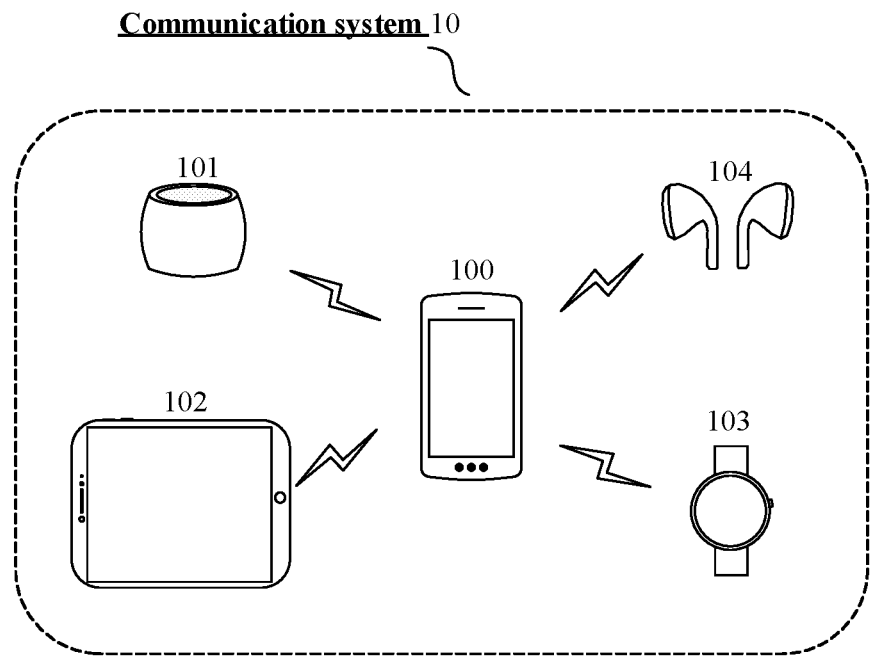
FIG. 1 is a schematic diagram of a system architecture of a communication system according to an embodiment of this application.

FIG. 1 shows a network architecture of a Bluetooth communication system 10 according to an embodiment of this application. As shown in FIG. 1, the Bluetooth communication system 10 may include: a terminal device 100 and at least one Bluetooth device, for example, a speaker 101, a tablet computer 102, a smart watch 103, and a Bluetooth headset 104 near the terminal device 100. Specifically, the terminal device 100 and/or the Bluetooth device may be static or mobile. In some embodiments of this application, the terminal device 100 may be implemented as a mobile phone, a tablet computer (Pad), a computer with a wireless transceiver function, a virtual reality (VR) terminal device, an augmented reality (AR) terminal device, a wireless terminal in industrial control, a wireless terminal in a smart grid, a wireless terminal in transportation safety, or the like. It is not limited to the speaker 101, the tablet computer 102, the smart watch 103, and the Bluetooth headset 104 that are shown in FIG. 1. The communication system 10 may further include another Bluetooth device, for example, a vehicle-mounted device or a wearable device.

Both the terminal device 100 and the Bluetooth device that are shown in FIG. 1 include a Bluetooth communication module, and a distance between the Bluetooth device and the terminal device 100 is within a preset range of Bluetooth communication. The terminal device 100 may detect and scan a Bluetooth device near the electronic device 100 by transmitting a signal through the Bluetooth communication module, so that the terminal device 100 can discover the nearby Bluetooth device through a Bluetooth communication protocol, establish a Bluetooth connection to the nearby Bluetooth device, and transmit data to the connected Bluetooth device. Instead, the Bluetooth device may alternatively scan and discover the terminal device 100, and establish a Bluetooth connection to the terminal device 100.

To implement interconnection between devices on different platforms, the Bluetooth communication protocol defines specifications for various possible and universe application scenarios, such as an A2DP (advanced audio distribution profile) and an HFP (hands-free profile). In an implementation, a largest payload indication bit of a Bluetooth data frame is 10 bits, in other words, a change range of a frame length of the data frame is 0 to 1024 bytes (that is, 0 to 1024*8 bits).

The Bluetooth communication system 10 is extremely sensitive to a delay, for example, after receiving data, a Bluetooth headset needs to process the data in extremely short time and reply with a confirmation message. In addition, in this type of system that has a requirement on low power consumption, information reporting power is usually limited, a reporting rate for reporting an information bit to a MAC layer is limited by the information reporting power, and the Bluetooth communication system 10 is mainly limited by a decoding delay and an information reporting delay. Therefore, the requirement on low power consumption brings a greater challenge to implementing a low-delay Bluetooth system.

In this embodiment of this application, a polar code segment encoding method is used in a Bluetooth communication system, to extend a largest payload length, and effectively improve a transmission capability and system performance while ensuring a low delay.

It is not limited to the foregoing Bluetooth communication system. The polar code segment encoding method provided in embodiments of this application is further applicable to the following communication systems: a narrowband internet of things system (NB-IoT), a global system for mobile communication (GSM), an enhanced data rate for GSM evolution system (EDGE), a wideband code division multiple access system (WCDMA), a code division multiple access 2000 system (CDMA2000), a time division-synchronization code division multiple access system (TD-SCDMA), a long term evolution system (LTE), a next-generation 5G mobile communication system, and the like. In other words, the polar code segment encoding method provided in embodiments of this application is applicable to information exchange between a network device and a terminal device in the foregoing communication systems, and information exchange between network devices in the foregoing communication systems. This is not specifically limited herein.

A core idea of polar code is channel polarization, to be specific, an encoding method is used on an encoding side to enable subchannels to present different reliability. When a code length continuously increases, a part of channels tends to be noiseless channels with a capacity close to 1, and another part of channels tends to be pure noisy channels with a capacity close to 0. Subsequently, direct transmission of information on a channel with a capacity close to 1 is selected to approach an ideal channel capacity. The polar code is the first encoding manner that is theoretically proven to reach a Shannon capacity, and has characteristics such as high performance and low encoding and decoding complexity. In different code lengths, especially for code based on a finite field, performance of the polar code is much better than Turbo code and LDPC code.

The polar code is a type of linear block code, a generator matrix of the polar code is $F_N$, and an encoding process of the polar code is $x_1^N = u_1^N F_N$. $u_1^N = (u_1, u_2, \ldots, u_N)$ is a binary row vector, and a length is N (namely, a code length). $F_N$ is a N×N matrix, and $F_N = F_2^{\otimes (log_2(N))}$, where $$F_2 = \begin{bmatrix} 1 & 0 \\ 1 & 1 \end{bmatrix},$$

and $F_2^{\otimes (log_2(N))}$ is defined as a Kronecker product of $log_2$ N matrices $F_2$.

In the encoding process of the polar code, channel capacities respectively corresponding to 1 to N information bits are calculated based on the generator matrix $F_N$, and k locations with a largest channel capacity are selected to transmit k information bits, where a set of indexes of the k information bits in $u_1^N$ is denoted as I. Other N−k locations with a small channel capacity are frozen bits, and the frozen bit is a fixed value (for example, 0) that is agreed by a transmit/receive end in advance. A set of indexes of the frozen bits in $u_1^N$ is represented by a complementary set $I^c$ of I. On a decoding side, decoding is performed based on a successive cancellation (SC) decoding algorithm, a successive cancellation list (SCL) decoding algorithm, or the like, to obtain, based on low implementation complexity, performance similar to that of largest likelihood decoding. A decoding algorithm is not particularly limited in embodiments. In this way, K information bits are encoded into N-bit mother code, where K<N. For the polar code, N has to be a power of 2. A larger N indicates a stronger error correction capability and a larger encoding gain, but also indicates higher decoding complexity and a higher decoding delay.

The polar code is linear block code. When a to-be-transmitted data packet is quite large and far exceeds a code length of largest mother code that is set by the polar code, segment processing may be performed on to-be-transmitted data.

It should be noted that, in the encoding process of the polar code, a code length of mother code output by an encoder is an integer power of 2. It is affected by a preset code rate, and when an actually required length of mother code is not an integer power of 2, rate matching needs to be performed in the encoding process to obtain the required code length. Rate matching manners of the polar code include shortening (Shorten), puncturing (Puncture), repetition (repeated), and/or the like. Usually, when the actually required code length is less than the code length of the mother code output by the encoder, a manner of shortening and/or puncturing may be used. When the actually required code length is greater than the code length of the mother code output by the encoder, a manner of repetition may be used. Specifically:

Shortening: To be specific, a to-be-encoded information vector $u_1^N$ is adjusted, so that bits at some specific locations in mother code after encoding are fixed values (which are usually 0), and another bit in the mother code is not affected as much as possible. In this way, a transmit end may not send the bits having the fixed values (for example, 0) in the mother code, but a receive end may still learn that the bits are the fixed values, so that a length of the mother code is shortened. Because the receive end learns that shortened locations are the fixed values, during rate de-matching, log likelihood ratios (LLRs) of these locations are filled with positive infinity for decoding.

Puncturing: bits at some specific locations in mother code after encoding are punctured, and another bit in the mother code is not affected as much as possible. In this way, a transmit end may not send the punctured bits in the mother code. A difference from the shortening manner is that the punctured bits during the puncturing are not necessarily the foregoing fixed values. For example, the punctured bits may be 0 or 1. When a receive end performs rate de-matching, LLRs of locations at which the puncturing is required are filled with 0 for decoding. This indicates that probabilities that bits at these locations for the puncturing are 0 or 1 each account for 50%.

Repetition: A part of a repeated bit sequence is added to mother code output by an encoder, and the repeated bit sequence is an existing bit sequence in the mother code.

The following uses the terminal device 100 side as an example to describe the polar code segment encoding method provided in embodiments of this application. The provided method is also applicable to the Bluetooth device side and the network device side in the foregoing communication system.

In some embodiments of this application, the terminal device 100 divides a first information bit sequence into n segments of information bit sequences based on a preset segment code length L (for example, 1024 bits) and a code rate 1. Correspondingly, mother code after the first information bit sequence is encoded includes n segments respectively corresponding to the n segments of information bit sequences, and a segment code length of each segment is L, where L is equal to an integer power of 2. Information bit quantities of first n−1 segments of information bit sequences in the n segments of information bit sequences are equal, and a code rate of a segment corresponding to each segment of information bit sequence is equal to the code rate 1. An information bit quantity of a last segment of information bit sequence may be equal to or not equal to each of the information bit quantities of the first n−1 segments of information bit sequences. When the two are not equal, rate matching may be performed on a segment corresponding to the last segment of information bit sequence (to be specific, in a rate matching manner such as puncturing, shortening, and/or repetition), so that a code rate of a last segment is equal to the code rate 1.

It should be noted that, in this embodiment of this application, a code length of a segment obtained by encoding each segment of information bit sequence is referred to as a segment code length of the segment for short.

Figure 2:
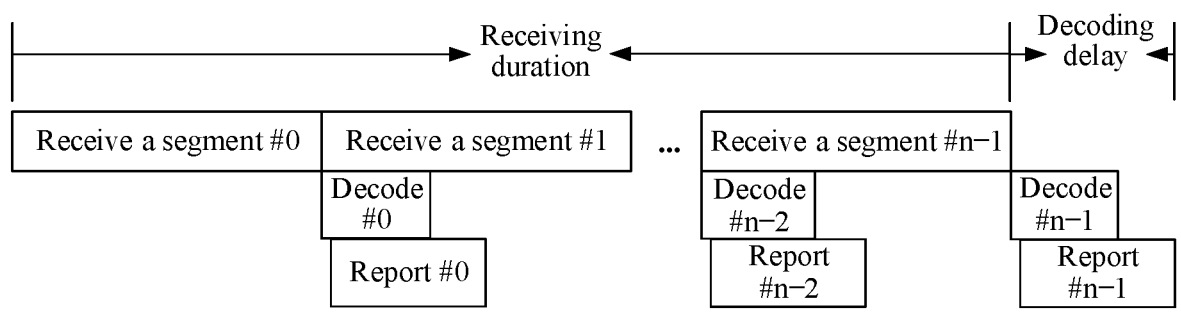
FIG. 2 is a schematic diagram of a decoding delay according to an embodiment of this application.

For example, FIG. 2 is a schematic diagram of a decoding delay of the foregoing polar code segment encoding method according to an embodiment of this application. A Bluetooth device starts, after receiving a segment each time, to decode the segment, and can report decoded data to an upper layer while decoding. An overall decoding delay is from a moment at which receiving of a last segment (namely, a segment #n−1) is completed (or a moment at which decoding starts) to a moment at which data reporting ends For example, a total information bit quantity of an information bit sequence is 1000 bits, a code rate 1 is equal to 0.25, and a segment code length L is equal to 1024. Based on the code rate 1 and L, the information bit sequence is divided into 4 segments, information bit quantities of first 3 segments each are 256 bits, and an information bit quantity of a 4th segment is 232 bits.

It can be learned from FIG. 2 that the overall decoding delay is mainly limited by decoding and reporting duration of the last segment, that is, limited by a segment code length of the last segment. In the foregoing polar code segment encoding scheme, if the segment code length L is increased (for example, a largest segment code length is selected), an error correction capability and an encoding gain can be improved, but decoding complexity and a decoding delay are also greater. On the contrary, if the segment code length L is reduced, the decoding complexity and the decoding delay can be reduced, but the error correction capability and the encoding gain are also poorer.

An embodiment of this application further provides a polar code segment encoding method, to effectively balance the decoding delay and encoding performance, that is, effectively improve system performance while meeting a requirement on a low delay.

For example, FIG. 3 is a flowchart of a polar code segment encoding method according to an embodiment of this application. As shown in FIG. 3, the polar segment encoding method provided in this embodiment of this application includes but is not limited to steps S201 to S204. The following further describes possible implementations of the method embodiments.

S201: Determine, based on an information bit quantity of a first information bit sequence and a first code rate, an initial code length and a target code length for encoding.

In this embodiment of this application, a terminal device 100 determines the target code length N2 based on the information bit quantity $K_0$ of the to-be-encoded first information bit sequence and the first code rate R. A value of N2 is ceil($K_0$/R), and ceil(x) indicates to round down x. A specific implementation of determining the initial code length includes but is not limited to an implementation 1 and an implementation 2.

Implementation 1: The initial code length N1 is determined based on the target code length N2 and a largest segment code length of $2^b$, where a value of N1 is ceil(N2/$2^b$)*$2^b$. According to the foregoing manner of determining the initial code length, it is ensured that the initial code length for the encoding is an integer multiple of the largest segment code length.

Implementation 2: The initial code length N1 is determined based on the target code length N2 and a smallest segment code length of $2^a$, where a value of N1 is ceil(N2/$2^a$)*$2^a$. According to the foregoing manner of determining the initial code length, it is ensured that the initial code length for the encoding is an integer multiple of the smallest segment code length.

It should be noted that, a segment code length corresponding to each segment obtained after polar code encoding is equal to a power of 2, is less than or equal to the largest segment code length of $2^b$ (for example, 1024), and is greater than or equal to the smallest segment code length of $2^a$ (for example, 128). In embodiments of this application, there are b−a+1 segment code lengths, and a $c^{th}$ segment code length in the b−a+1 segment code lengths is $2^c$, where a, b, and c are positive integers, and a≤c≤b.

For example, $K_0$ is 10000 bits, the first code rate is 2/3, a is equal to 7, and b is equal to 10. It may be obtained through calculation that N2 is equal to 15000 bits. It is determined, in the foregoing implementation 1, that N1 is equal to 15960 bits (that is, 15 1024 bits). It is determined, in the foregoing implementation 2, that N1 is equal to 15104 bits (that is, 14 1024 bits plus 768 bits).

In addition, in embodiments of this application, the first code rate is a preset encoding parameter, and the terminal device 100 may directly obtain the first code rate. Alternatively, the first code rate may be indirectly obtained by the terminal device 100 based on known information. In an implementation, the first code rate is determined based on a preset quantity of input information bits and a preset quantity of output information bits.

S202: Divide, based on the first code rate and the initial code length, mother code corresponding to the first information bit sequence into S segments, where a segment code length of an $i^{th}$ segment in the S segments is greater than or equal to a segment code length of an $(i+1)^{th}$ segment, and a segment code length of an $S^{th}$ segment in the S segments is less than the largest segment code length.

It may be understood that, in embodiments of this application, the terminal device 100 is intended to perform segment encoding on the first information bit sequence. To control an overall decoding delay of the mother code obtained after the first information bit sequence is encoded, in embodiments of this application, a segment code length of a segment obtained by encoding each segment of information bit sequence is first determined, so that segment code lengths of segments in the mother code are in a descending trend. To be specific, the initial code length of the mother code is first divided into S segments, and then the first information bit sequence is divided into the S segments of information bit sequences based on segment code lengths of the S segments. According to this embodiment of this application, system performance can be effectively improved while a requirement on a decoding delay is ensured.

In some embodiments, the segment code length of the $S^{th}$ segment in the S segments is less than the largest segment code length. In this way, after the polar code segment encoding is performed on the first information bit sequence, a segment code length of a last segment in the mother code is less than the largest segment code length, which effectively reduces decoding and reporting duration of the last segment.

In some embodiments, segment code lengths of last s segments in the S segments each are less than the largest segment code length, where s is a positive integer greater than 1 and less than S. It may be understood that, at least two segments at a tail of the S segments each are less than the largest segment code length. In this way, an excessively large difference between the segment code length of the $S^{th}$ segment and a segment code length of an $(S−1)^{th}$ segment in the S segments is avoided. It should be noted that, when a difference between the segment code length of the $S^{th}$ segment and the segment code length of the $(S−1)^{th}$ segment is excessively large, decoding and reporting of the $(S−1)^{th}$ segment may still not end when receiving of the $S^{th}$ segment is completed, and therefore, an overall decoding delay of the first information bit sequence is affected. For example, as shown in FIG. 4, segment code lengths of first S−1 segments in the S segments each are the largest segment code length, the segment code length of the $S^{th}$ segment (that is, a segment #S−1) in the S segments is the smallest segment code length, and the overall decoding delay of the first information bit sequence is affected by decoding and reporting duration of the $(S−1)^{th}$ segment (that is, a segment #S−2) in the S segments.

In embodiments of this application, the terminal device 100 determines, based on the initial code length and the b−a+1 segment code lengths, a quantity of segments corresponding to each of the b−a+1 segment code lengths; and divides the initial code length into the S segments based on the quantity of segments corresponding to each of the b−a+1 segment code lengths.

Figure 5:
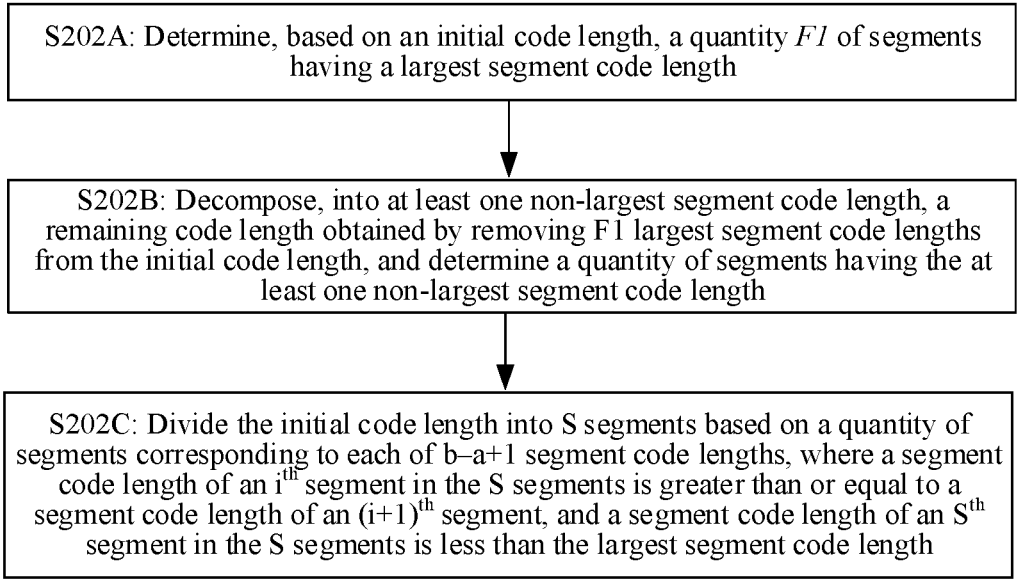
FIG. 5 is a schematic flowchart of a segmentation method according to an embodiment of this application.

In some embodiments, as shown in FIG. 5, implementation of step S202 may specifically include but is not limited to steps S202A and S202B. Specifically:

S202A: Determine a quantity F1 of segments having the largest segment code length based on the initial code length.

In some embodiments, the terminal device 100 calculates the initial code length N1 in the foregoing implementation 1, where the initial code length is an integer multiple of the largest segment code length, and the terminal device 100 determines that a value of the quantity F1 of segments having the largest segment code length is $N1/2^{\wedge b}-1$. For example, it is determined, in the implementation 1, that N1 is equal to 15960 bits (that is, 15 1024 bits), and it may be obtained through calculation that F1 is equal to 14.

In some embodiments, the terminal device 100 calculates the initial code length N1 in the foregoing implementation 2, where the initial code length is not an integer multiple of the largest segment code length, and the terminal device 100 determines that a value of the quantity F1 of segments having the largest segment code length is $\text{floor}(N1/2^{\wedge b})$ or $\text{floor}(N2/2^{\wedge b})$. For example, it is determined, in the implementation 1, that N1 is equal to 15104 bits (that is, 14 1024 bits plus 768 bits), and it may be obtained through calculation that F1 is equal to 14.

S202B: Decompose, into at least one non-largest segment code length, a first remaining code length obtained by removing F1 largest segment code lengths from the initial code length, and determine a quantity of segments having the at least one non-largest segment code length.

In embodiments of this application, the first remaining code length N3 may be represented as $N1-F1*2^{\wedge b}$, and the non-largest segment code length is $2^i$, where $a \leq i < b$. Refer to the foregoing implementation 1 and implementation 2. Both the initial code length N1 and the b−a+1 segment code lengths are an integer multiple of the smallest segment code length (that is, $2^a$). Therefore, the first remaining code length is also an integer multiple of the smallest segment code length. Therefore, the terminal device 100 may decompose the first remaining code length N3 into the at least one non-largest segment code length, that is $$N3 = \sum_{i=a}^{b-1} M_i * 2^i,$$

and $M_i$ represents the quantity of segments having the segment code length of $2^i$.

S202C: Divide the initial code length into S segments based on a quantity of segments corresponding to each of the b−a+1 segment code lengths, where a segment code length of an $i^{th}$ segment in the S segments is greater than or equal to a segment code length of an $(i+1)^{th}$ segment in the S segments, and a segment code length of an $S^{th}$ segment in the S segments is less than the largest segment code length.

It may be understood that, a sum of quantities of segments having the b−a+1 segment code lengths is S, and the initial code length of the mother code is divided into the S segments in descending order of the segment code lengths.

Figure 6:
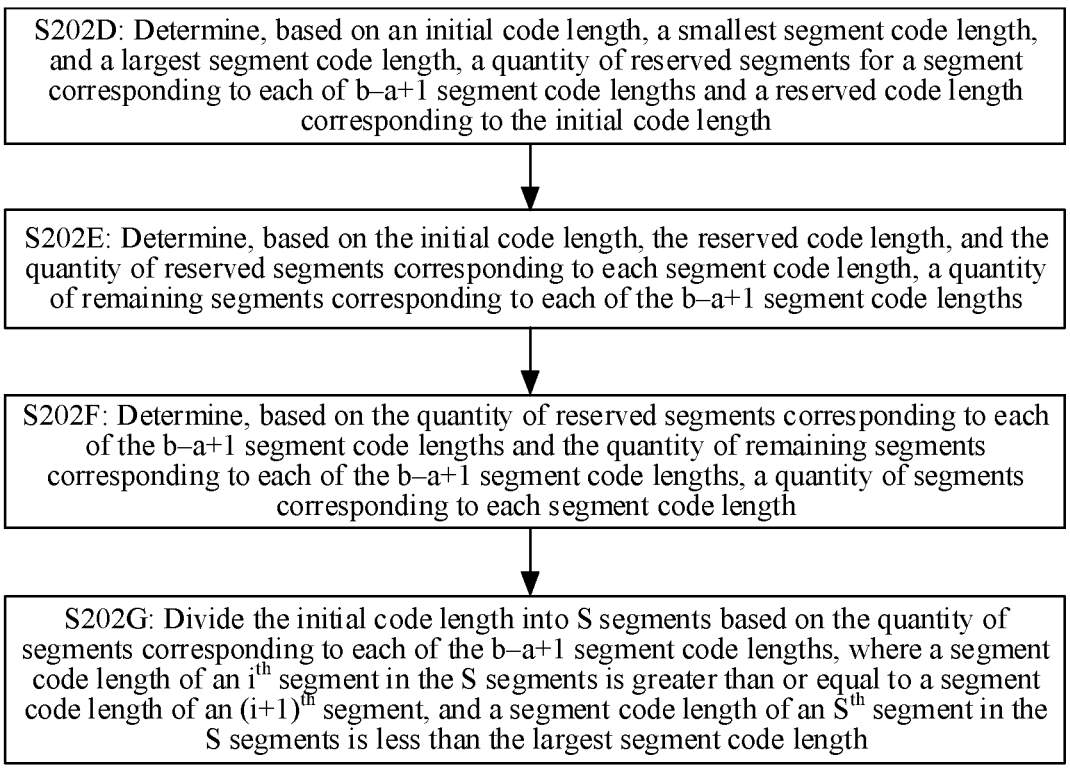
FIG. 6 is a schematic flowchart of another segmentation method according to an embodiment of this application.

In embodiments of this application, step S202 may alternatively be implemented in another segmentation manner. In some embodiments of this application, as shown in FIG. 6, step S202 may alternatively specifically include but is not limited to steps S202D to S202G. Specifically:

S202D: Determine, based on the initial code length, the smallest segment code length and the largest segment code length, a quantity of reserved segments for a segment corresponding to each of the b−a+1 segment code lengths and a reserved code length corresponding to the initial code length.

In embodiments of this application, to implement that segment code lengths of last s segments of the S segments each are less than the largest segment code length, and the segment code lengths of the last s segments are in a descending trend, to be specific, a segment code length of a $(j+1)^{th}$ segment in the last s segments is less than or equal to a segment code length of a $j^{th}$ segment in the last s segments, the terminal device 100 may reserve a specific quantity of segments for a small segment code length in advance after determining the initial code length. It may be understood that the specific quantity of segments is preferentially reserved for the small segment code length, so that it can be ensured that a segment code length of a tail segment of the mother code after the first information bit sequence is encoded is less than the largest segment code length.

In some embodiments, the determining a quantity of reserved segments corresponding to an $i^{th}$ segment code length of the b−a+1 segment code lengths and a reserved code length corresponding to the initial code length N1 includes: determining, based on the initial code length and segment code lengths of the segments and in ascending order of the segment code lengths, the quantity of reserved segments corresponding to the $i^{th}$ segment code length of the b−a+1 segment code lengths, where the reserved code length corresponding to the initial code length may be determined based on the quantity of reserved segments corresponding to each segment code length.

In an implementation, the determining a quantity of reserved segments corresponding to an $i^{th}$ segment code length of the b−a+1 segment code lengths and a reserved code length corresponding to the initial code length N1 specifically includes: when $N1 < p*2^{\wedge a}$, determining that a quantity of reserved segments for a segment having a segment code length of $2^{\wedge a}$ is $$\text{floor}\left(\frac{N1}{2^{\wedge a}}\right),$$

and a quantity of reserved segments for a segment having a segment code length of $2^{\wedge j}$ is 0, where $a < j \leq b$; when $$p * \sum_{i=a}^{c} 2^{\wedge i} \leq N1 < p * \sum_{i=a}^{c+1} 2^{\wedge i},$$

determining that the quantity of reserved segments for the segment having the segment code length of $2^{\wedge j}$ is 0, a quantity of reserved segments for a segment having a segment code length of $2^{\wedge c+1}$ is $$\text{floor}\left(\frac{N1 - p * \sum_{i=a}^{c} 2^{\wedge i}}{2^{\wedge c+1}}\right),$$

and a quantity of reserved segments for a segment having a segment code length of $2^{\wedge v}$ is P, where $a \leq c \leq b-1$, $a \leq v \leq c$, and $c+1 < j \leq b$; or when $$p * \sum_{i=a}^{b} 2^{\wedge i} \leq N1,$$

$$p * \sum_{i=a}^{b} 2^{\wedge i} \leq N1,$$

determining that the quantity of reserved segments corresponding to each segment code length is P. The reserved code length $N_{res}$ corresponding to N1 is determined based on the quantity of reserved segments corresponding to each segment code length, and $$N_{res} = \sum_{c=a}^{b} m_c * 2^{\wedge c},$$

where $m_c$ represents a quantity of reserved segments for a segment having a segment code length of $2^{\wedge c}$.

Relative to a receiving rate, when a reporting rate is very low, reporting of a last segment does not end after receiving of a current segment is completed. This causes a great impact on a delay of decoding and reporting. In this embodiment of this application, a value of P may be determined based on an actual situation, and a lower reporting rate relative to a receiving rate indicates a larger value of P.

It should be noted that, a Bluetooth bandwidth is equal to $B_1$, a reporting bandwidth is equal to $B_2$, and a code rate is R. N corresponds to S segments, and segment code lengths of the $i^{th}$ segment and the $(i+1)^{th}$ segment in the S segments are respectively $N_i$ and $N_{i+1}$. Receiving duration of the $(i+1)^{th}$ segments is $$\frac{N_{i+1}}{B_1},$$

and reporting duration of the $i^{th}$ segment is $$\frac{N_i * R}{B_2}.$$

When $$\frac{N_i * R}{B_2} > \frac{N_{i+1}}{B_1},$$

reporting of the $i^{th}$ segment does not end after receiving of the $(i+1)^{th}$ segment ends, and therefore, a start point of reporting of the $(i+1)^{th}$ segment is affected. In this case, $$B_2 < \frac{N_i * R}{N_{i+1}} * B_1.$$

Therefore, in the foregoing case, an overall decoding delay may be affected. In this application, $N_i \geq N_{i+1}$, and to reduce impact of the reporting of the $i^{th}$ segment on the reporting of the $(i+1)^{th}$ segment, it may be set that $N_i = N_{i+1}$. Therefore, in this embodiment of this application, to effectively reduce the impact of the reporting of the $i^{th}$ segment on a decoding delay, P segments may be reserved in advance for a same segment code length.

For example, if the value of P is 2, a value of a is 7, and a value of b is 8, quantities of reserved segments respectively corresponding to four segment code lengths are determined based on N1, as shown in Table 1.

TABLE 1

| N1 | $m_{10}$ | $m_9$ | $m_8$ | $m_7$ |
|---|---|---|---|---|
| N1 < 256 | 0 | 0 | 0 | $\text{floor}\left(\frac{N1}{128}\right)$ |
| $256 \leq N1 < 768$ | 0 | 0 | $\text{floor}\left(\frac{N1-256}{256}\right)$ | 2 |
| $768 \leq N1 < 1792$ | 0 | $\text{floor}\left(\frac{N1-768}{512}\right)$ | 2 | 2 |
| $1792 \leq N1 < 3840$ | $\text{floor}\left(\frac{N1-1792}{1024}\right)$ | 2 | 2 | 2 |
| $3840 \leq N1$ | 2 | 2 | 2 | 2 |

It can be learned from Table 1 that when N1<256, a reserved code length corresponding to N1 is $$\text{floor}\left(\frac{N1}{256}\right) * 2^{\wedge 7};$$

when $256 \leq N1 < 768$, the reserved code length corresponding to N1 is $p*2^{\wedge 7}$, that is, 256; when $768 \leq N1 < 1792$, the reserved code length corresponding to N1 is $p*(2^{\wedge 7}+2^{\wedge 8})$, that is, 768; when $1792 \leq N1 < 3840$, the reserved code length corresponding to N1 is $p*(2^{\wedge 7}+2^{\wedge 8}+2^{\wedge 9})$, that is, 1792; or when $3840 \leq N1$, the reserved code length corresponding to N1 is $p*(2^{\wedge 7}+2^{\wedge 8}+2^{\wedge 8}+2^{\wedge 9})$, that is, 3840.

In some embodiments, the value of P is 1, and the terminal device 100 does not need to reserve a plurality of segments for each of segments having a same segment code length. This is applicable to a case in which $$B_2 \geq \frac{N_4 * R}{N_5} * B_1.$$

For example, if the value of P is 1, the value of a is 7, and the value of b is 8, the quantities of reserved segments respectively corresponding to the four segment code lengths are determined based on N1, as shown in Table 2.

TABLE 2

| N1 N1 | $m_{10}$ | $m_9$ | $m_8$ | $m_7$ |
|---|---|---|---|---|
| N1 < 128 | 0 | 0 | 0 | 0 |
| 128 ≤ N1 < 384 | 0 | 0 | 0 | 1 |
| 384 ≤ N1 < 896 | 0 | 0 | 1 | 1 |
| 896 ≤ N1 < 1920 | 0 | 1 | 1 | 1 |
| 1920 ≤ N1 | 1 | 1 | 1 | 1 |

It may be understood that, when N1<128, the reserved code length corresponding to N1 is 0; when 128≤N1<384, the reserved code length corresponding to N1 is $2^7$; when 384≤N1<896, the reserved code length corresponding to N1 is $2^7+2^8$, that is, 384; when 89≤N1<1920, the reserved code length corresponding to N1 is $2^7+2^8+2^9$, that is, 896; or when 1920<N1, the reserved code length corresponding to N1 is $2^7+2^8+2^{8}+^9$, that is, 1920.

S202E: Determine, based on the initial code length, the reserved code length, and the quantity of reserved segment corresponding to each segment code length, a quantity of remaining segments corresponding to each of the b−a+1 segment code lengths.

In some embodiments, the determining, based on the initial code length, the reserved code length, and the quantity of reserved segments corresponding to each segment code length, the quantity of segments corresponding to each of the b−a+1 segment code lengths specifically includes: The terminal device 100 obtains a second remaining code length based on the initial code length and the reserved code length; sequentially determines, based on the second remaining code length and in descending order of the segment code lengths, quantities of remaining segments corresponding to the segment code lengths, that is, segments the second remaining code length again; and determines, based on the quantity of reserved segments corresponding to each segment code length and the quantity of remaining segments corresponding to each segment code length, a quantity of segments having the segment code length. It may be understood that, quantities of remaining segments for the segments are sequentially determined in descending order of the segment code lengths, and the second remaining code length may be preferentially allocated to a segment having a large segment code length.

It should be noted that, a larger segment code length indicates a better encoding gain and a better error correction capability. In an optional embodiment of step S202D, to reduce a decoding delay limit as much as possible, a quantity of segments is first reserved for a segment having a small segment code length. When the decoding delay limit is met, the second remaining code length is preferentially allocated to a segment having a large segment code length, to improve overall encoding performance of encoding the first information sequence.

In some embodiments, the determining, based on the initial code length, the reserved code length, and the quantity of reserved segments corresponding to each segment code length, a quantity of remaining segments corresponding to each of the b−a+1 segment code lengths specifically includes: when $N1<2^{\wedge a}$, determining that a quantity $z_c$ of remaining segments for a segment having a segment code length of $2^{\wedge c}$ is 0, where a<c≤b, and a quantity $z_a$ of remaining segments for a segment having a segment code length of $2^{\wedge a}$ is 1; or when $N1 \geq 2^{\wedge a}$, sequentially determining, in descending order of the segment code lengths, the quantities of remaining segments corresponding to the segment code lengths, where a quantity $z_b$ of remaining segments for a segment having a segment code length of $2^{\wedge b}$ is $$\text{floor}\left(\frac{N1 - N_{res}}{2^{\wedge b}}\right),$$

the quantity $z_c$ of remaining segments for the segment having the segment code length of $2^{\wedge c}$ is $$\text{floor}\left(\frac{N1 - N_{res} - \sum_{e=c+1}^{b} z_e * 2^{\wedge e}}{2^{\wedge c}}\right),$$

and a≤c<b.

For example, if the value of a is 7, and the value of b is 10, it is determined that the four segment code lengths are respectively 1024, 512, 256, and 128. Descriptions are made using examples in which the value of N1 is 1024, 2048, 2560, or 6144 separately. When the value of N1 is 1024, a reserved code length corresponding to N1 is 896, and a second remaining code length is 128; when the value of N1 is 2048, the reserved code length corresponding to N1 is 1920, and the second remaining code length is 128; when the value of N1 is 2560, the reserved code length corresponding to N1 is 1920, and the second remaining code length is 640; or when the value of N1 is 6144, the reserved code length corresponding to N1 is 1920, and the second remaining code length is 4224. When the value of N1 is 1024, 2048, 2560, or 6144 separately, corresponding quantities of remaining segments of the four segments are shown in Table 3.

TABLE 3

| N1 | Second remaining code length | $z_{10}$ | $z_9$ | $z_8$ | $z_7$ |
|---|---|---|---|---|---|
| 1024 | 128 | 0 | 0 | 0 | 1 |
| 2048 | 128 | 0 | 0 | 0 | 1 |
| 2560 | 640 | 0 | 1 | 0 | 1 |
| 6144 | 4224 | 4 | 0 | 0 | 1 |

S202F: Determine, based on the quantity of reserved segments corresponding to each of the b−a+1 segment code lengths and the quantity of remaining segments corresponding to each of the segment code lengths, the quantity of segments corresponding to each segment code length.

In some embodiments, the terminal device 100 determines that a quantity of segments having the segment code length of $2^{\wedge c}$ is $M_c$, where $M_c = m_c + z_c$, and a≤c≤b. It may be understood that, $M_b = F1$.

For example, the value of a is 7, the value of b is 10, and the four segment code lengths are respectively 1024, 512, 256, and 128. When the value of N1 is 2048, quantities of reserved segments corresponding to the four segment code lengths are respectively 1, 1, 1, and 1, and quantities of remaining segments corresponding to the four segment code lengths are respectively 0, 0, 0, and 1. Therefore, quantities of segments having the four segments corresponding to N1 are respectively 1, 1, 1, and 2.

S202G: Divide the initial code length into S segments based on the quantity of segments corresponding to each of the b−a+1 segment code lengths, where a segment code length of an $i^{th}$ segment in the S segments is greater than or equal to a segment code length of an $(i+1)^{th}$ segment in the S segments, and a segment code length of an $S^{th}$ segment in the S segments is less than the largest segment code length.

It is not limited to the segmentation manner described in the related embodiments in FIG. 5 and FIG. 6. In embodiments of this application, the terminal device 100 may alternatively implement step S202 in another segmentation manner. This is not specifically limited herein.

In some embodiments, a quantity of segments having a segment code length of $2^{\wedge i}$ and a quantity of segments having a segment code length of $2^{\wedge i+2}$ are both greater than 0, and a quantity of segments having a segment code length of $2^{\wedge i+1}$ is 0, where a≤i≤b−2. For example, a quantity of segments having a segment code length of 1024 and a quantity of segments having a segment code length of 256 are both greater than 0, and a quantity of segments having a segment code length of 512 is 0. In some embodiments, the quantity of segments having the segment code length of $2^{\wedge i}$ and a quantity of segments having a segment code length of $2^{\wedge i+3}$ are both greater than 0, and the quantity of segments having the segment code length of $2^{\wedge i+1}$ and the quantity of segments having the segment code length of $2^{\wedge i+2}$ are both 0, where a≤i≤b−3. For example, the quantity of segments having the segment code length of 1024 and a quantity of segments having a segment code length of 128 are both greater than 0, and the quantity of segments having the segment code length of 512 and the quantity of segments having the segment code length of 256 are both 0.

It may be understood that, in embodiments of this application, two segment code lengths respectively corresponding to two adjacent segments in the S segments may be a same segment code length, or may be two adjacent segment code lengths in the b−a+1 segment code lengths, or may be two non-adjacent segment code lengths in the b−a+1 segment code lengths. This is not specifically limited herein.

S203: Determine a target information bit quantity of each segment based on segment code lengths of the S segments and the first code rate, and divide the first information bit sequence into S segments of information bit sequences based on the target information bit quantity of each segment.

In some embodiments, the determining, based on segment code lengths of the S segments and the first code rate, a target information bit quantity corresponding to each segment specifically includes: The terminal device 100 decomposes the information bit quantity $K_0$ of the first information bit sequence into $$\sum_{c=a}^{b} M_c * K_c$$

in a decomposition manner agreed in a protocol, to determine a target information bit quantity of a segment corresponding to each segment code length. $K_c$ is a target information bit quantity of a segment having a segment code length of $2^c$, $K_c<2^c$, and a≤c≤b.

In some embodiments, the determining, based on segment code lengths of the S segments and the first code rate, a target information bit quantity corresponding to each segment specifically includes: First, the terminal device 100 determines, based on the first code rate R, a target information bit quantity $K_b$ of each of first F1 segments having the largest segment code length in the S segments, where $K_b$ is ceil($2^{\wedge b}*R$) (or floor($2^{\wedge b}*R$)); further determines that a remaining information bit quantity $K_{res}$ corresponding to a segment having a non-largest segment code length is equal to N1−F1*$K_b$; and then determines a target information bit quantity of a segment corresponding to each non-largest segment code length, that is, a target information bit quantity of a segment having a segment code length of $2^i$ based on the remaining information bit quantity $K_{res}$ and a quantity of segments corresponding to each non-largest segment code length, where a≤i<b.

It may be understood that, the largest segment code length in the segment code lengths of the S segments is $2^r$. When r is less than b, a quantity F1 of segments having the largest segment code length is equal to 0, and a sum of quantities of segments having non-largest segment code lengths is equal to S.

In some embodiments, the determining a target information bit quantity of a segment corresponding to each non-largest segment code length specifically includes: decomposing the remaining information bit quantity $K_{res}$ into $$\sum_{i=a}^{b-1} M_i * K_i$$

in a decomposition manner agreed on a protocol, to determine the target information bit quantity of the segment corresponding to each non-largest segment code length. $K_i$ is a target information bit quantity of a segment having a segment code length of $2^i$, $K_i<2^i$, and a≤i<b.

In some embodiments, the determining a target information bit quantity of a segment corresponding to each non-largest segment code length specifically includes: determining, based on the first code rate, a reference information bit quantity, that is, ceil($2^{\wedge i}*R$) (or floor($2^{\wedge i}*R$)) of a segment corresponding to a non-largest segment code length of $2^i$, where a≤i<b; and when a sum $K1_{refer}$ of reference information bit quantities of S−F1 segments having non-largest segment code lengths is greater than $K_{res}$, reducing the reference information bit quantities of the S−F1 segments having the non-largest segment code lengths, to obtain target information bit quantities of the S−F1 segments, where $K1_{refer}-K_{res}$ information bits are reduced in total in the S−F1 segments having the non-largest segment code lengths.

Specifically, in an implementation, if $K1_{refer}-K_{res}$ is less than a reference information bit quantity of a last segment in the S segments, it is determined that a target information bit quantity of the last segment is obtained by subtracting $K1_{refer}-K_{res}$ from the reference information bit quantity of the segment, and a target information bit quantity of a segment having a non-largest segment code length other than the last segment is a reference information bit quantity of the segment. When $K1_{refer}-K_{res}$ is greater than or equal to a sum of reference information bit quantities of last j segments and is less than a sum of reference information bit quantities of last j+1 segments, the reference information bit quantities of the last j segments are reduced, to obtain target information bit quantities of the last j segments. A total of $K1_{refer}-K_{res}$ is subtracted from the reference information bit quantities of the last j segments, and a target information bit quantity of a segment having a non-largest segment code length other than the last j segments is a reference information bit quantity of the segment.

Specifically, in another implementation, a reduction proportion of an information bit quantity of a segment having a smaller segment code length is larger, so that a code rate corresponding to the segment having the smaller segment code length is lower. For example, a first weight factor for reducing an information bit quantity corresponding to a segment code length is set. A smaller segment code length indicates a larger first weight factor corresponding to the segment code length, so that a larger information bit quantity of a segment having the smaller segment code length is reduced, and a code rate corresponding to the segment is lower. A reduced information bit quantity of the $i^{th}$ segment in the S segments may be represented as $y_i*K^i*x$, where $y_i$ is a first weight factor corresponding to a segment code length of the $i^{th}$ segment, $K^i$ is a reference information bit quantity of the $i^{th}$ segment, $a \leq i \leq a+j-1$, and reduced information bit quantities of the last j segments satisfy $$K1_{refer} - K_{res} = \sum_{i=a}^{a+j-1} y_i * K^i * x.$$

x in the foregoing formula is solved, so that a reduced information bit quantity of each of the last j segments can be solved, and a target information bit quantity of each of the last j segments is further determined. When a calculated reduced information bit quantity is not an integer, rounding processing may be performed (for example, rounding up may be performed on all segments, rounding down may be performed on all the segments, or rounding up is performed on a back segment and rounding down is performed on a front segment), and a total of the reduced information bit quantities of the last j segments is equal to $K1_{refer}-K_{res}$ through fine tuning. A manner of the fine tuning is not specifically limited. For example, after the rounding processing, if the total of the reduced information bit quantities is t greater than $K1_{refer}-K_{res}$, t information bits are further reduced from the last segment. If the total of the reduced information bit quantities is t less than $K1_{refer}-K_{res}$, t information bits are added to any segment (for example, a j segment from the last) other than the last segment.

It should be noted that, in a same channel environment and a same segment code rate, a larger segment code length of a segment indicates a lower packet error rate corresponding to the segment and a higher encoding gain; and in a same channel environment and a same segment code length, a smaller code rate of a segment indicates a lower packet error rate corresponding to the segment and a higher encoding gain. In some embodiments of this application, a target information bit quantity of each segment may be adjusted, so that a code rate corresponding to a segment having a smaller segment code length is lower, and therefore, encoding performance corresponding to the segment is improved.

For example, $K_0$ is 10000 bits, N1 is equal to 15960 bits (that is, 15 1024 bits), a is equal to 7, and b is equal to 10. According to the foregoing embodiments, it is determined that F1 is 14, the second remaining code length is 1024 bits, and the second remaining code length may be divided into 512 bits, 256 bits, 128 bits, and 128 bits, which respectively correspond to last four segments in the S segments. Therefore, it is determined that a target information bit quantity of a segment having a largest segment code length is 683, and reference information bit quantities of the last four segments are respectively 342, 170, 86, and 86. That is, $K1_{refer}$ and $K_{res}$ are respectively 684 and 437, and $K1_{refer}-K_{res}$ is equal to 247. 247 is greater than reference information bit quantities (that is, 172) of last two segments, and is less than a sum of reference information bit quantities (that is, 342) of last three segments. A total of 247 is subtracted from the reference information bit quantities of the last three segments. A weight factor corresponding to a segment code length of 256 bits is set to 0.4, and a weight factor corresponding to a segment code length of 128 bits is set to 0.6. After the foregoing formula is solved and the rounding processing is performed, it is determined that 97 bits are reduced for a segment having a segment code length of 256 bits, and 75 bits and 75 bits are respectively reduced for two segments having a segment code length of 128 bits. The target information bit quantities corresponding to the last four segments are respectively 342 bits, 73 bits, 11 bits, and 11 bits.

In some embodiments, the determining, based on segment code lengths of the S segments and the first code rate, a target information bit quantity corresponding to each segment specifically includes: The terminal device 100 determines a reference information bit quantity of each of the S segments based on the first code rate and the segment code lengths of the segments: and determines a target information bit quantity of the segment based on the reference information bit quantity of each segment and a segment code length of the segment. Optionally, it is determined, based on a code rate R and the segment code lengths of the segments, that a reference information bit quantity of a segment having a segment code length of $2^{\wedge c}$ in the S segments is $ceil(2^{\wedge c}*R)$ (or).

It may be understood that, to ensure that a reference information bit quantity of a segment is a positive integer, $(2^{\wedge c}*R)$ needs to be rounded up. Therefore, in the foregoing implementations, a sum $K2_{refer}$ of reference information bit quantities of the S segments is greater than or equal to an information bit quantity $K_0$, and segment code rates of the S segments are almost equal. Specifically, $$K2_{refer} = \sum_{c=a}^{b} M_c * ceil(2^{\wedge c} * R).$$

It should be noted that, in embodiments of this application, the reference information bit quantity of each segment may be first determined, and then the target information bit quantity of each segment is adjusted based on the reference information bit quantity and an actual requirement.

In some embodiments, the determining a target information bit quantity of the segment based on the reference information bit quantity of each segment and a segment code length of the segment includes: determining the target information bit quantity of each of the S segments based on the reference information bit quantity of each of the S segments and a first redundant bit quantity, where a sum of target information bit quantities of the S segments is the information bit quantity $K_0$ of the first information bit sequence, and the first redundant bit quantity is obtained by subtracting a sum of parameter information bit quantities of the S segments from $K_0$, that is, $K2_{refer}-K_0$.

In some embodiments, the determining a target information bit quantity of the segment based on the reference information bit quantity of each segment and a segment code length of the segment may specifically include: determining that a target information bit quantity of the $i^{th}$ segment in the S segments is obtained by subtracting $K2_{refer}-K_0$ from a reference information bit quantity of the segment: and determining that a target information bit quantity of a second segment other than the $i^{th}$ segment in the S segments is a reference information bit quantity of the second segment. The second segment is any segment other than the $i^{th}$ segment in the S segments. $1 \leq i \leq S$, and i may be a value agreed in advance. This is not specifically limited in embodiments of this application. In an implementation, i is equal to S, to be specific, it is determined that a target information bit quantity of the $S^{th}$ segment in the S segments is obtained by subtracting $K2_{refer}-K_0$ from a reference information bit quantity of the segment.

In some embodiments, the largest segment code length of the S segments is $2^r$, and a quantity of segments having a segment code length of $2^r$ in the S segments is $M_r$, where $a \leq r \leq b$. The determining the target information bit quantity of each of the S segments based on the reference information bit quantity of each of the S segments and a first redundant bit quantity includes: determining that a target information bit quantity of a segment having a segment code length of $2^r$ in the S segments is a parameter information bit quantity of the segment having the segment code length of $2^r$; and allocating the first redundant information bit quantity to target information bit quantities of $S-M_r$ segments having segment code lengths less than $2^b$ in the S segments, and determining that a target information bit quantity of a second segment in the $S-M_r$ segments having the segment code lengths less than $2^b$ is obtained by subtracting an allocated redundant information bit quantity from a parameter information bit quantity of the second segment. The second segment is any segment in the $S-M_r$ segments having the segment code length less than $2^b$.

In some embodiments, the determining the target information bit quantity of each of the S segments based on the reference information bit quantity of each of the S segments and a first redundant bit quantity includes: when the first redundant information bit quantity is less than the segment code length of the $S^{th}$ segment in the S segments, determining that a target information bit quantity of the $S^{th}$ segment is obtained by subtracting the first redundant information bits from a reference information bit quantity of the $S^{th}$ segment, where target information bit quantities of first $S-1$ segments in the S segments are reference information bit quantities of the first $S-1$ segments; or when the first redundant information bit quantity is greater than or equal to a sum of reference information bit quantities of last j segments in the S segments, and is less than a sum of reference information bit quantities of last j+1 segments in the S segments, allocating the first redundant information bit quantity to the last j segments, and determining that target information bit quantities of the last j segments are obtained by subtracting allocated redundant information bit quantities from parameter information bit quantities of the last j segments, where target information bit quantities of first $S-j$ segments in the S segments are reference information bit quantities of the first $S-j$ segments. In an implementation, a segment having a smaller segment code length is allocated with a larger redundant information bit quantity.

In some embodiments, the largest segment code length of the segment code lengths of the S segments is $2^r$, and the determining a target information bit quantity of the segment based on the reference information bit quantity of each segment and a segment code length of the segment specifically includes: adding, based on the reference information bit quantity of each segment, an information bit quantity to a segment having a segment code length of $2^r$, to obtain a target information bit quantity of the segment: and reducing a total information bit quantity for $S-f$ segments having segment code lengths less than $2^r$, to obtain the target information bit quantity of the segment. A total of a first information bit quantity is added to $M_r$ segments having the segment code length of $2^r$, and a total of the first information bit quantity plus $K2_{refer}-K_0$ is reduced for the $S-f$ segments having the segment code length less than. In addition, a code rate of a segment having a smaller segment code length in the $S-f$ segments is enabled to be smaller.

In some embodiments, a segment code length of a segment having the largest segment code length in the S segments is $2^r$, and the determining a target information bit quantity of the segment based on the reference information bit quantity of each segment and a segment code length of the segment specifically includes: when r is equal to a, reducing reference information bit quantities of $M_a$ segments having a smallest segment code length, and obtaining a target information bit quantity of each of the $M_a$ segments, where a total of $K2_{refer}-K_0$ information bits is reduced for the $M_a$ segments; or when r is greater than a, determining that a target information bit quantity of the segment having the segment code length of $2^r$ is a sum of the reference information bit quantity of the segment and $$\sum_{c=a}^{r-1} \partial_c * M_c,$$

and a target information bit quantity of a segment having a segment code length of $2^c$ is obtained by subtracting $\partial_c * M_r + k^c$ from a reference information bit quantity of the segment.

$$\sum_{c=a}^{r-1} k^c * M_c = K2_{refer} - K_0,$$

$a \leq c < r$, $\partial_c$ is a proportion parameter of the segment having the segment code length of $2^c$, and $\partial_c$ is a positive integer.

In an implementation, $0 < \partial_{c+1} \leq 2\partial_c$. It should be noted that, when $0 < \partial_{c+1} < 2\partial_c$, code rates of the $S-f$ segments may be in a descending trend.

For example, a value of a is 7, a value of b is 10, and four segment code lengths are respectively 1024, 512, 256, and 128. A value of $K_0$ is 1024 and a code rate is 0.5. It can be learned from the solutions provided in embodiments of this application that, a value of N1 is 2048, and quantities of segments corresponding to the four segment code lengths are respectively 1, 1, 1, and 2. Reference information bit quantities corresponding to the four segment code lengths are respectively 512, 256, 128, and 64. If values of $\partial_7$, $\partial_8$, and $\partial_9$ are respectively set to 2, 4, and 6, information bit quantities corresponding to the four segment code lengths are respectively 526, 250, 124, and 62. Segment code rates of the four segments are respectively 0.5137, 0.4883, 0.4844, 0.4844, and 0.4844. Therefore, it can be learned that the segment code lengths of four segments in mother code are in a descending trend, and the segment code rates of the four segments are also in a descending trend.

It should be noted that, when r is equal to b, and a quantity $M_b$ of segments is large, an excessively large information bit quantity is added to the segment having the largest segment code length in the S segments, and an excessively large information bit quantity is reduced for another segment.

In some embodiments, to avoid the foregoing problem, the determining a target information bit quantity of the segment based on the reference information bit quantity of each segment and each quantity of segments specifically includes: when $M_b>T$, determining that a target information bit quantity of each of first T segments in $M_b$ segments having a segment code length of $2^{\sim b}$ is a sum of a reference information bit quantity of the segment and $$\sum_{c=a}^{b-1} \partial_c * M_c,$$

a target information bit quantity of each of last $M_b-T$ segments in the $M_b$ segments is equal to a reference information bit quantity of the segment, and a target information bit quantity of a segment having a segment code length of $2^{\sim c}$ is obtained by subtracting $\partial_c*T+k^c$ from a reference information bit quantity of the segment, where T is a positive integer, $$\sum_{c=a}^{r-1} k^c * M_c = k_0,$$

$a \leq c \leq b$, $\partial_c$ are a positive integer, and $\partial_{c+1} > \partial_c$.

It may be understood that the target information bit quantity of each segment is adjusted based on the reference information bit quantity, to enable a code rate of a segment having a largest segment code length in the S segments to be increased, a code rate of a segment having a non-largest segment code length in the S segments to be decreased, and a code rate of a segment having a smaller segment code length in segments having non-largest segment code lengths to be smaller. Therefore, encoding performance of a segment having a large segment code length described above is properly reduced, encoding performance of a segment having a small segment code length is properly improved, and finally, overall system performance can be effectively improved.

S204: Perform polar code encoding on the S segments of information bit sequences based on a segment code length corresponding to each segment of information bit sequence; and when the initial code length is different from the target code length, perform rate matching on the S segments in a polar code encoding process based on the first code rate and the segment code lengths of the S segments, where an actual code length of the mother code (that is, the S segments) corresponding to the first information bit sequence after the rate matching is the target code length.

It should be noted that, a segment code length of polar code is limited to be a power of 2. As a result, a preset first code rate cannot be met because a total code rate after the first information bit sequence is encoded is limited. For example, $K_0$ is 10000 bits, the first code rate is 2/3, a is equal to 7, and b is equal to 10. It may be obtained through calculation based on the first code rate that a target code length N2 is equal to 15000 bits. It is determined, in the foregoing implementation 1, that an initial code length N1 is equal to 15960 bits, a difference between N1 and N2 is 960 bits, and a code rate corresponding to N1 is approximately 0.6266. Alternatively, in the foregoing implementation 2, it is determined that the initial code length N1 is equal to 15104 bits, the difference between N1 and N2 is 104 bits, and the code rate corresponding to N1 is approximately 0.6621.

In embodiments of this application, when the initial code length is the same as the target code length, the terminal device 100 separately performs polar code encoding on the S segments of information bit sequences based on the segment code length corresponding to each segment of information bit sequence. When the initial code length is different from the target code length, the terminal device 100 separately performs polar code encoding on the S segments of information bit sequences based on the segment code length corresponding to each segment of information bit sequence, and performs rate matching on the S segments in a segment encoding process, where a total bit quantity for the rate matching is a first bit quantity, which is a different between the initial code length and the target code length, that is, |N1−N2|; and a total code length corresponding to the S segments after the rate matching is the target code length, so that it is ensured that the total code rate after the first information bit sequence is encoded is the preset first code rate. The following specifically describes how to perform rate matching when the initial code length is different from the target code length.

In some embodiments, the target code length is greater than the initial code length. The terminal device adds a redundant bit to a preset location of the S segments in the mother code, and separately performs rate matching on the S segments whose total code length is the initial code length. A total bit quantity required for the rate matching of the S segments (that is, a total bit quantity of redundant bits added to the S segments) is a first bit quantity. Specifically, in an implementation, the terminal device 100 repeats existing N1−N2 information bits in the mother code at the preset location of the S segments in the mother code. For example, last N1−N2 information bits corresponding to a first segment having a non-largest code length are repeated at a tail of the first segment having the non-largest code length, and a bit quantity of redundant bits added to another segment is 0. In another implementation, the terminal device 100 adds a total of N1−N2 redundant bits having a fixed value to the preset location of the S segments in the mother code, where the fixed value is a preset fixed value (for example, 0) known by both a transmit end and a receive end. For example, N1−N2 redundant bits are added to the tail of the first segment having the non-largest code length, and the bit quantity of redundant bits added to the another segment is 0.

In some embodiments, the target code length is less than the initial code length. The terminal device separately performs, in a puncturing and/or shortening manner, rate matching on the S segments whose total code length is the initial code length. A total bit quantity for the puncturing and/or shortening of the S segments (that is, a total bit quantity required for the rate matching of the S segments) is a first bit quantity.

In the foregoing polar code encoding process, the performing rate matching on the S segments in a polar code encoding process based on the first code rate and the segment code lengths of the S segments, where an actual code length of the mother code (that is, the S segments) corresponding to the first information bit sequence after the rate matching is the target code length specifically includes:

determining, based on a segment code length of a first segment in the S segments, an initial bit quantity for rate matching of the first segment; and determining that a bit quantity for the rate matching of the first segment is a sum of an adjusted bit quantity of the first segment and a result of rounding down or rounding up the initial bit quantity of the first segment, where the adjusted bit quantity of the first segment is determined based on a difference between the first bit quantity and a sum of values obtained by rounding off initial bit quantities of the S segments. The first segment is any of the S segments.

It may be understood that, in embodiments of this application, the first bit quantity for the rate matching is shared by at least one of the S segments. The following specifically describes how to determine a bit quantity required for rate matching of each of the S segments. A specific implementation includes but is not limited to an implementation 3 to an implementation 6. Specifically:

Implementation 3: It is determined, based on a proportion of each segment code length in the initial code length, a bit quantity required for rate matching of a segment corresponding to the segment code length.

For example, a proportion of a segment code length of $2^i$ of a segment in the initial code length is $2^i/N1$, and an initial bit quantity required for rate matching of a segment is $2^i/N1*|N1-N2|$. It should be noted that, in embodiments of this application, when a calculated initial bit quantity for rate matching is not an integer, rounding processing may be performed (for example, rounding up is performed on all segments, rounding down is performed on all the segments, or rounding up is performed on a back segment and rounding down is performed on a front segment), and a total bit quantity for the rate matching of the S segments is equal to N1−N2 through fine tuning. A manner of the fine tuning is not specifically limited. It may be understood that a fine tuning value is an adjusted bit quantity added or reduced for each segment, and the adjusted bit quantity may be equal to 0. For example, after the rounding processing, if the total bit quantity for the rate matching is g greater than N1−N2, g bits are subtracted from a total bit quantity for rate matching of a last segment. In other words, an adjusted bit quantity of the last segment is −g, and an adjusted bit quantity of another segment is 0. If the total bit quantity for the rate matching is g less than N1−N2, g bits are added for a preset segment (for example, a penultimate segment) other than a last segment. In other words, an adjusted bit quantity of the last segment is g, and an adjusted bit quantity of another segment is 0.

Implementation 4: Initial bit quantities required for the rate matching of the segments are equal, that is, |N1−N2|/ S. When a calculated initial bit quantity for rate matching is not an integer, rounding and fine tuning are performed, so that a total bit quantity for the rate matching of the S segments is N1−N2. Specifically, for implementation of the rounding and fine tuning, refer to the foregoing implementation 3.

Implementation 5: Second weight factors for rate matching corresponding to different segment code lengths are set. When the target code length is less than the initial code length, a second weight factor corresponding to a segment having a smaller segment code length is smaller. Optionally, a ratio of a second weight factor corresponding to a segment code length of $2^{c+1}$ to a second weight factor corresponding to a segment code length of $2^c$ is greater than 2. An initial bit quantity required for rate matching of a segment corresponding to the segment code length of $2^c$ in the S segments may be represented as $h_c*x$, where $h_c$ represents the second weight factor corresponding to the segment code length of $2^c$, and initial bit quantities required for the rate matching of the S segments satisfy $$N1 - N2 = \sum_{c=a}^{b} h_c * M_c * x.$$

x in the foregoing formula is solved, so that an initial bit quantity required for rate matching of each segment can be solved. When a calculated initial bit quantity for rate matching is not an integer, rounding and fine tuning are performed, so that a total bit quantity for the rate matching of the S segments is N1−N2. Specifically, for implementation of the rounding and fine tuning, refer to the foregoing implementation 3.

It should be noted that, a second weight factor corresponding to a segment having a smaller segment code length is smaller, so that a bit quantity for puncturing and/or shortening of the segment having the smaller segment code length is smaller. A ratio of a second weight factor corresponding to a segment code length of $2^{c+1}$ to a second weight factor of a segment code length of $2^c$ is greater than 2, so that an increase amplitude of a code rate of a segment having a large code length is large, and an increase amplitude of a code rate of a segment having a small code length is small, to effectively balance encoding performance of different segments.

Implementation 6: The first bit quantity for the rate matching is shared by F1 segments corresponding to a largest segment code length, and an initial bit quantity required for rate matching of each of the F1 segments is (N1−N2)/F1. When a calculated initial bit quantity for rate matching is not an integer, rounding and fine tuning are performed, so that a total bit quantity for the rate matching of the F1 segments is N1−N2. Specifically, for implementation of the rounding and fine tuning, refer to the foregoing implementation 3.

For example. $K_0$ is 10000 bits. N1 is equal to 15960 bits. N2 is equal to 15000 bits, and N1−N2 is equal to 960 bits; and a first information bit sequence is divided into 18 segments, which respectively correspond to 14 1024-bit segments, one 512-bit segment, one 256-bit segment, and two 128-bit segments, and a total of 960 bits are required for rate matching of the 18 segments. In the foregoing implementation 3, it can be obtained through calculation that bit quantities required for rate matching of the 1024-bit, 512-bit, 256-bit, and 128-bit segments are respectively 64 bits, 32 bits, 16 bits, and 8 bits. In the foregoing implementation 4, it may be obtained through calculation that a bit quantity required for rate matching of each segment is 24 bits. In the foregoing implementation 5, second weight factors respectively corresponding to 1024 bits, 512 bits, 256 bits, and 128 bits are set as follows: 2.7, 0.9, 0.3, and 0.1. It can be obtained through calculation that a bit quantity required for rate matching of each of first 5 1024-bit segments is 67, a bit quantity required for rate matching of each of last 9 1024-bit segments is 66, and bit quantities required for rate matching of the 512-bit, 256-bit, and 128-bit segments are 22 bits, 7 bits, and 2 bits respectively. In the foregoing implementation 6, a bit quantity required for rate matching of each of first 7 1024-bit segments is 69, a bit quantity required for rate matching of each of last 7 1024-bit segments is 68, and a bit quantity required for rate matching of another segment is 0.

Figure 7:
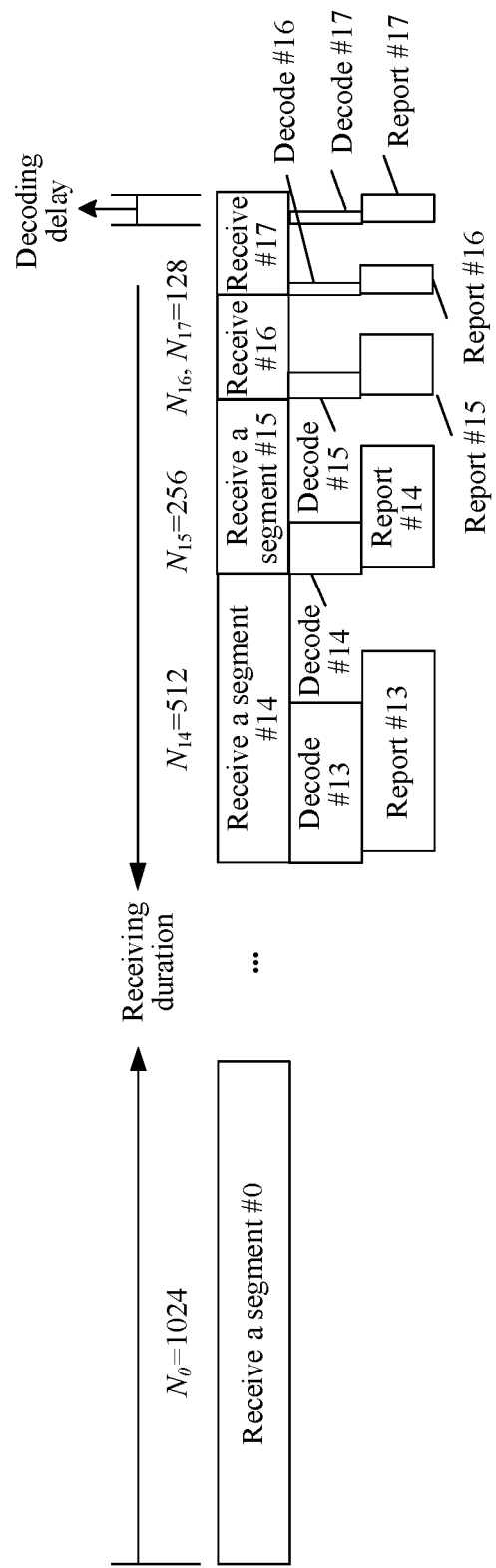
FIG. 7 is a schematic diagram of another decoding delay according to an embodiment of this application.

Based on the foregoing embodiments, FIG. 7 shows an example of a schematic diagram of a decoding delay according to an embodiment of this application. As shown in FIG. 7, in this embodiment of this application, after polar code segment encoding is performed on a first information bit sequence, segment code lengths of tail segments are in a descending trend. Because a decoding delay of the first information bit sequence is mainly limited by decoding and reporting duration of a last segment, the decoding delay can be greatly reduced by implementing this embodiment of this application.

Figure 8:
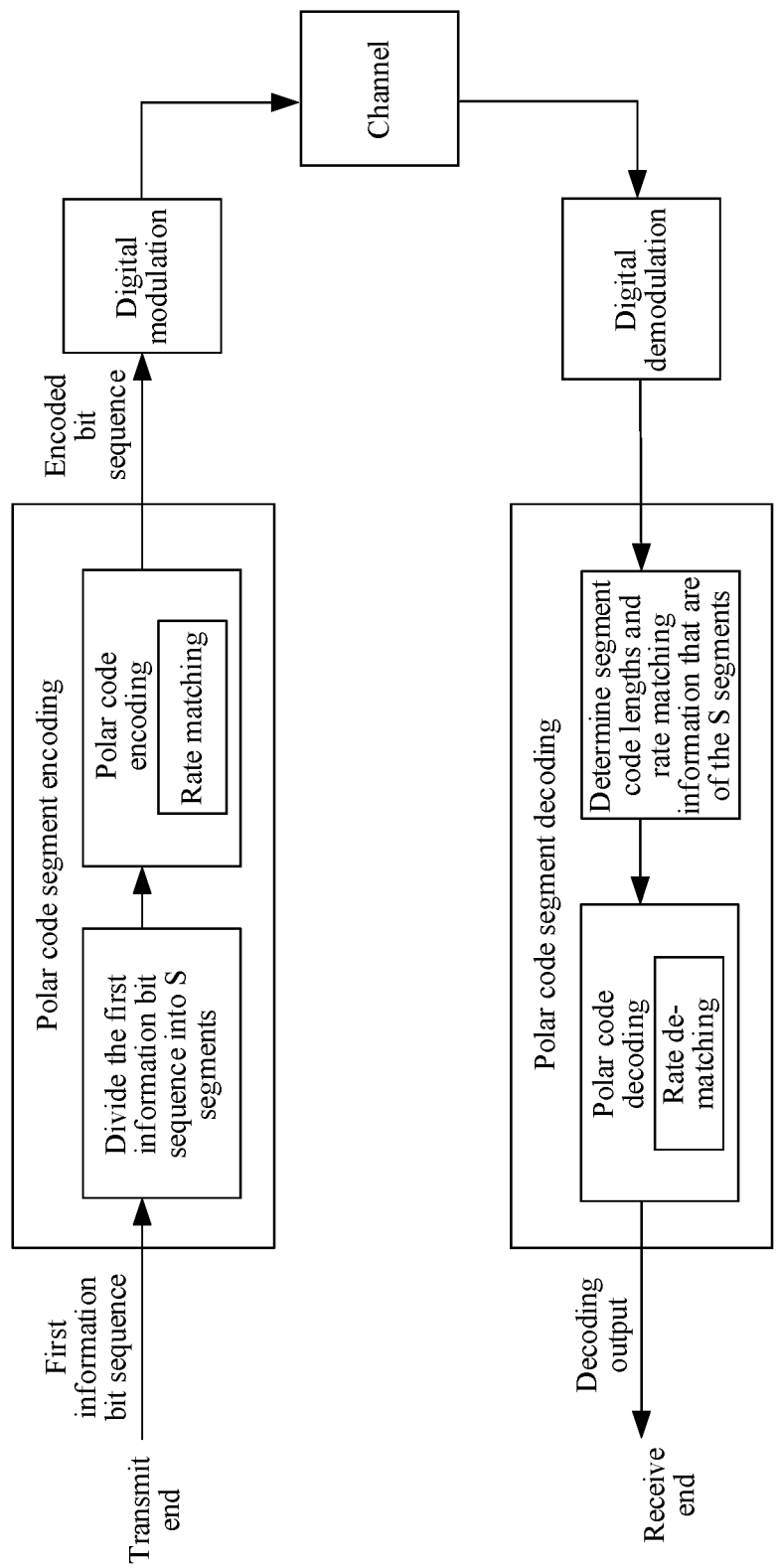
FIG. 8 is a schematic diagram of another principle of polar code segment encoding and segment decoding according to an embodiment of this application.

FIG. 8 is a schematic diagram of a principle of polar code segment encoding and segment decoding according to an embodiment of this application;

Refer to FIG. 8. A transmit end device establishes a Bluetooth connection to a receive end device.

At the transmit end, a to-be-encoded first information bit sequence is divided into S segments of information bit sequences. Specifically, the transmit end divides mother code corresponding to the first information bit sequence into S segments, and determines a target information bit quantity of each of the S segments; and further divides the first information bit sequence into the S segments of information bit sequences based on the target information bit quantity of each of the S segments. Subsequently, based on a segment code length corresponding to each segment of information bit sequence, polar encoding is performed on the segment of information bit sequence, and rate matching is performed in an encoding process. An encoded bit sequence obtained through the encoding is digitally modulated and sent through a wireless channel (for example, a Bluetooth channel).

At the receive end, after receiving data sent by the transmit end, the receive end performs polar segment decoding on the data after digital demodulation. Specifically, according to the segment encoding method provided in embodiments of this application, segment code lengths and rate matching information that are of the S segments corresponding to the first information bit sequence are determined. Based on the segment code lengths and the rate matching information that are of the S segments, polar decoding is performed on received data, and rate de-matching is performed in a polar decoding process, to obtain the first information bit sequence.

The transmit end and the receive end may be a terminal device 100 or a Bluetooth device in the Bluetooth communication system shown in FIG. 1, or may be a network device or a terminal device in the foregoing another wireless communication system.

The following describes a hardware structure of a terminal device 100 according to an embodiment of this application.

Figure 9:
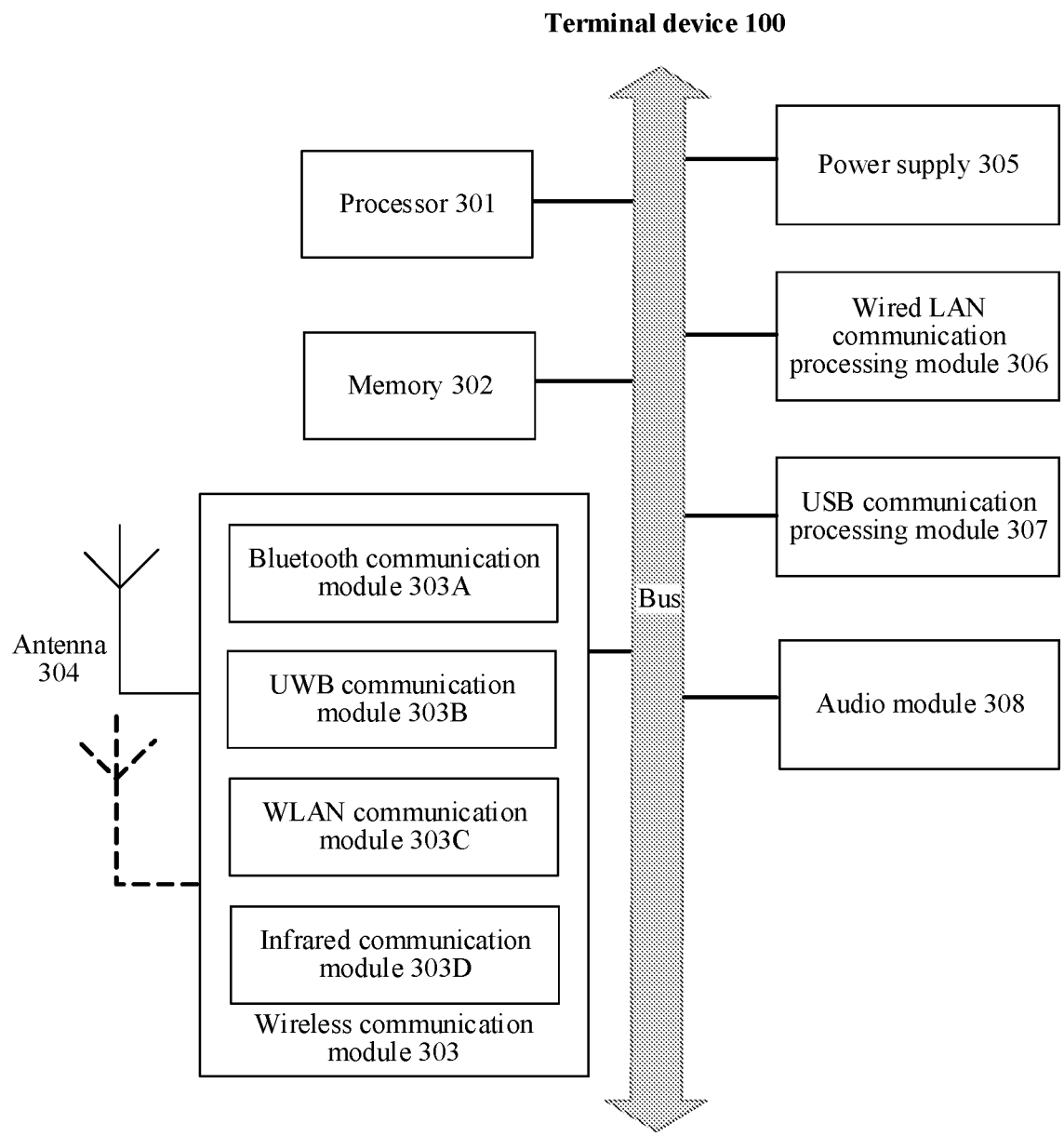
FIG. 9 is a schematic diagram of a structure of a terminal device according to an embodiment of this application.

For example, FIG. 9 shows an example of a schematic diagram of a structure of a terminal device 100 according to an embodiment of this application.

As shown in FIG. 9, the terminal device 100 may include: a processor 301, a memory 302, a wireless communication processing module 303, an antenna 304, a power supply switch 305, a wired LAN communication processing module 306, a USB communication processing module 307, and an audio module 308. Specifically, the processor 301 may be configured to read and execute computer-readable instructions. During specific implementation, the processor 301 may mainly include a controller, an arithmetic unit, and a register. The controller is mainly responsible for decoding instructions and sending a control signal for an operation corresponding to the instructions. The arithmetic unit is mainly responsible for storing a register operand, an intermediate operation result, and the like that are temporarily stored during instruction execution. During specific implementation, a hardware architecture of the processor 301 may be an application-specific integrated circuit (ASIC) architecture, an MIPS architecture, an ARM architecture, an NP architecture, or the like.

In some embodiments, the processor 301 may be configured to parse a signal, for example, a probe request broadcast by the terminal 100, received by the wireless communication module 303 and/or the wired LAN communication processing module 306. The processor 301 may be configured to perform a corresponding processing operation, for example, generate a probe response, based on a parsing result.

In some embodiments, the processor 301 may be further configured to generate a signal, for example, a Bluetooth broadcast signal or a beacon signal, sent by the wireless communication module 303 and/or the wired LAN communication processing module 306.

The memory 302 is coupled to the processor 301, and is configured to store various software programs and/or a plurality of groups of instructions. During specific implementation, the memory 302 may include a high-speed random access memory, and may also include a non-volatile memory, for example, one or more disk storage devices, a flash device, or another non-volatile solid-state storage device. The memory 302 may store an operating system, for example, an embedded operating system such as uCOS, VxWorks, or RTLinux. The memory 302 may further store a communication program. The communication program may be used for communicating with the terminal 100, one or more servers, or an accessory device.

The wireless communication module 303 includes a Bluetooth communication module 303A, and may further include one or more of a UWB communication module 303B, a WLAN communication module 303C, and an infrared communication module 303D. The Bluetooth communication module 303A may be integrated into a chip (System on Chip, SOC), and the UWB communication module 303A may alternatively be integrated with another communication module (for example, the WLAN communication module 303C) in hardware (or software).

In some embodiments, one or more of the Bluetooth communication module 303A, the UWB communication module 303B, the WLAN communication module 303C, and the infrared communication module 303D may listen to a signal, such as a measurement signal or a scanning signal, transmitted by another device (for example, a Bluetooth device 101), and may send a response signal, such as a measurement response or a scanning response, so that the another device (for example, the Bluetooth device 101) can discover the terminal device 10, and a wireless communication connection to the another device (for example, the Bluetooth device 101) is established using one or more of Bluetooth, UWB, WLAN, or infrared short-distance wireless communication technologies, to perform data transmission.

In some other embodiments, one or more of the Bluetooth communication module 303A, the UWB communication module 303B, the WLAN communication module 303C, and the infrared communication module 303D may alternatively transmit a signal, for example, a broadcast UWB measurement signal and a beacon signal, so that another device (for example, a Bluetooth device 101) can discover the terminal device 100, and a wireless communication connection to the another device (for example, the Bluetooth device 101) is established using one or more of Bluetooth, UWB, WLAN, or infrared short-distance wireless communication technologies, to perform data transmission.

The wireless communication module 303 may further include a cellular mobile communication module (not shown). The cellular mobile communication processing module may communicate with another device (for example, a server) via a cellular mobile communication technology.

The antenna 304 may be configured to transmit and receive an electromagnetic wave signal. Antennas of different communication modules may be reused, or may be independent of each other, to improve antenna utilization. For example, an antenna of the Bluetooth communication module 303A may be reused as an antenna of the WLAN communication module 303B. For example, the Bluetooth communication module 303A may alternatively use an independent antenna.

The power supply switch 305 may be configured to control a power supply to supply power to the terminal device 100.

The wired LAN communication processing module 306 may be configured to communicate with another device in a same LAN via a wired LAN, and may be configured to connect to a WAN via a wired LAN, and may communicate with a device in the WAN.

The USB communication processing module 307 may be configured to communicate with another device through a USB interface (not shown).

The audio module 308 may be configured to output an audio signal through an audio output interface, and in this way, the terminal device 100 can support audio playing. The audio module may be further configured to receive audio data through an audio input interface. The terminal device 100 may be a media playing device such as a wireless headset or a speaker.

It should be understood that the terminal device 100 shown in FIG. 9 is merely an example, and the terminal device 100 may have more or fewer components than those shown in FIG. 9, or two or more components may be combined, or there may be a different component configuration. Various components shown in the figure may be implemented in hardware, software, or a combination of hardware and software including one or more signal processing and/or application-specific integrated circuits.

In embodiments of this application, for hardware structures of a Bluetooth device and a network device described in related embodiments of the communication system 10, refer to the related descriptions of the terminal device 100. Details are not described in this application again.

In conclusion, the foregoing embodiments are merely intended for describing the technical solutions of this application, rather than limiting this application. Although this application is described in detail with reference to the foregoing embodiments, a person of ordinary skill in the art should understand that, modifications may still be made to the technical solutions described in the foregoing embodiments, or equivalent replacements may be made to some technical features thereof. In addition, the modifications or replacements do not make the essence of the corresponding technical solutions depart from the scope of the technical solutions of embodiments of this application.

What is claimed is:

1. A polar code segment encoding method, comprising:
   determining, based on an information bit quantity of a first information bit sequence and a first code rate, a target code length for polar code encoding;
   determining an initial code length based on the target code length, wherein the initial code length is an integer multiple of a smallest segment code length;
   dividing the first information bit sequence into S segments of information bit sequences based on the first code rate and the initial code length, wherein the S segments of information bit sequences correspond to S encoded segments, wherein a segment code length of an $i^{th}$ segment in the S segments is greater than or equal to a segment code length of an $(i+1)^{th}$ segment in the S segments, a segment code length of an $S^{th}$ segment in the S segments is less than a largest segment code length, a sum of segment code lengths of the S segments is equal to the initial code length, and a segment code length of a segment is a power of 2;
   determining that the initial code length is different from the target code length;
   performing rate matching on the S segments in a process of performing polar code encoding on the S segments of information bit sequences to obtain an encoded bit sequence, wherein the sum of the segment code lengths of the S segments is the target code length after the rate matching, and wherein a total bit quantity for the rate matching of the S segments is a difference between the initial code length and the target code length; and
   digitally modulating and sending the encoded bit sequence through a wireless channel.

2. The method according to claim 1, wherein the smallest segment code length is $2^a$, the largest segment code length is $2^b$, a $c^{th}$ segment code length in b−a+1 segment code lengths is $2^c$, a, b, and c are positive integers, and a≤c≤b; and wherein the dividing the first information bit sequence into S segments of information bit sequences comprises:
   dividing the initial code length into the S segments based on the first code rate;
   determining a target information bit quantity of each of the S segments based on the segment code lengths of the S segments; and
   dividing the first information bit sequence into the S segments of information bit sequences based on the target information bit quantity of each segment.

3. The method according to claim 1, wherein the target code length N2 corresponding to the first information bit sequence is ceil($K_0$/R), wherein $K_0$ represents the information bit quantity of the first information bit sequence, and R represents the first code rate.

4. The method according to claim 3, wherein a value of the initial code length N1 is ceil(N2/$2^b$)*$2^b$, the initial code length is an integer multiple of the largest segment code length, and ceil(x) indicates to round up x; or
   a value of the initial code length N1 is ceil(N2/$2^a$)*$2^a$.

5. The method according to claim 2, wherein the performing rate matching on the S segments comprises:
   in the process of performing polar code encoding on the S segments of information bit sequences, performing rate matching respectively on each of the S segments by puncturing or shortening when the target code length is less than the initial code length; or
   in the process of performing polar code encoding on the S segments of information bit sequences, performing rate matching respectively on each of the S segments by adding a redundant bit at a preset location of the S segments when the target code length is greater than the initial code length.

6. The method according to claim 5, wherein the performing rate matching on the S segments comprises:

determining, based on a segment code length of a first segment in the S segments, an initial bit quantity for rate matching of the first segment; and determining that a bit quantity for the rate matching of the first segment is a sum of an adjusted bit quantity of the first segment and a result of rounding down or rounding up the initial bit quantity of the first segment, wherein the adjusted bit quantity of the first segment is determined based on a difference between the first bit quantity and a sum of values obtained by rounding off initial bit quantities of the S segments.

7. The method according to claim 6, wherein the segment code length of the first segment is $2^c$, and $a \leq c \leq b$; and wherein the determining, based on a segment code length of a first segment in the S segments, an initial bit quantity for rate matching of the first segment comprises:

determining, based on a proportion of the segment code length of the first segment in the initial code length, that the initial bit quantity required for the rate matching of the first segment is $2^c/N1 * |N1-N2|$.

8. The method according to claim 6, wherein the $b-a+1$ segment code lengths each corresponds to a second weight factor for rate matching, and the segment code length of the first segment is $2^c$, and $a \leq c \leq b$; and wherein the determining, based on a segment code length of a first segment in the S segments, an initial bit quantity for rate matching of the first segment comprises:

determining that the initial bit quantity for the rate matching of the first segment is $h_c * x$, wherein $h_c$ represents a second weight factor corresponding to the segment code length of $2^c$, and a sum of the initial bit quantities for the rate matching of the S segments is equal to the first bit quantity.

9. The method according to claim 8, wherein in response to determining that the target code length is less than the initial code length, a smaller segment code length indicates a smaller second weight factor corresponding to the segment code length; or in response to determining that the target code length is greater than the initial code length, a smaller segment code length indicates a larger second weight factor corresponding to the segment code length.

10. The method according to claim 6, wherein the largest segment code length in the segment code lengths of the S segments is $2^r$, $a \leq r \leq b$, a quantity of segments having the segment code length of $2^r$ in the S segments is $M_r$, and a bit quantity for rate matching of a segment having a segment code length less than $2^r$ in the S segments is 0; and the determining, based on a segment code length of a first segment in the S segments, an initial bit quantity for rate matching of the first segment comprises:

determining that the initial bit quantity for the rate matching of the first segment in the $M_r$ segments having the segment code length of $2^r$ in the S segments is $|N1-N2|/M_r$.

11. The method according to claim 6, wherein the determining, based on a segment code length of a first segment in the S segments, an initial bit quantity for rate matching of the first segment comprises:

determining that the initial bit quantity for the rate matching of the first segment in the S segments is $|N1-N2|/S$.

12. The method according to claim 2, wherein the dividing the initial code length into the S segments based on the first code rate comprises:

determining, based on the initial code length and the $b-a+1$ segment code lengths, a quantity of segments corresponding to each of the $b-a+1$ segment code lengths; and dividing the initial code length into the S segments based on the quantity of segments corresponding to each of the $b-a+1$ segment code lengths, wherein the segment code length of the $i^{th}$ segment in the S segments is greater than or equal to the segment code length of the $(i+1)^{th}$ segment in the S segments, and the segment code length of the $S^{th}$ segment in the S segments is less than the largest segment code length.

13. The method according to claim 12, wherein the determining, based on the initial code length and the $b-a+1$ segment code lengths, a quantity of segments corresponding to each of the $b-a+1$ segment code lengths comprises:

determining a quantity F1 of segments having the largest segment code length based on the initial code length and the largest segment code length of $2^{-b}$;

decomposing, into at least one non-largest segment code length, a first remaining code length obtained by removing F1 largest segment code lengths from the initial code length; and determining a quantity of segments corresponding to each of the at least one non-largest segment code length, wherein the non-largest segment code length is a segment code length less than $2^{-b}$.

14. The method according to claim 13, wherein in response to determining that the initial code length is the integer multiple of the largest segment code length, a value of F1 is $N1/2^{-b}-1$; or in response to determining that the initial code length is not the integer multiple of the largest segment code length, the value of F1 is $\text{floor}(N1/2^{-b})$, and $\text{floor}(x)$ indicates to round down x.

15. The method according to claim 12, wherein the determining, based on the initial code length and the $b-a+1$ segment code lengths, a quantity of segments corresponding to each of the $b-a+1$ segment code lengths comprises:

determining, based on the initial code length and the $b-a+1$ segment code lengths, a quantity of reserved segments corresponding to each of the $b-a+1$ segment code lengths;

determining, based on the quantity of reserved segments corresponding to each segment code length, a reserved code length corresponding to the initial code length;

determining, based on the initial code length, the reserved code length, and the quantity of reserved segments corresponding to each segment code length, a quantity of remaining segments corresponding to each segment code length; and determining that the quantity of segments corresponding to each segment code length is a sum of the quantity of reserved segments corresponding to each segment code length and the quantity of remaining segments corresponding to each segment code length.

16. The method according to claim 2, wherein the determining a target information bit quantity of each of the S segments based on the segment code lengths of the S segments comprises:

decomposing, in a decomposition manner comprised in a protocol, the information bit quantity of the first information bit sequence into $$\sum_{c=a}^{b} M_c * K_c,$$

wherein $M_c$ represents a quantity of segments having the segment code length of $2^c$ in the S segments, $K_c$ represents a target information bit quantity of the segment having the segment code length of $2^c$ in the S segments, $K_c < 2^c$, and $a \leq c \leq b$.

17. The method according to claim 2, wherein the determining a target information bit quantity of each of the S segments based on the segment code lengths of the S segments comprises:
determining, based on the first code rate and the b−a+1 segment code lengths, that a reference information bit quantity of a segment having the segment code length of $2^c$ in the S segments is $\operatorname{ceil}(2^{\wedge c}*R)$ or $\operatorname{floor}(2^{\wedge c}*R)$, wherein $a \leq c \leq b$; and
determining the target information bit quantity of each of the S segments based on a reference information bit quantity of each of the S segments and a first redundant bit quantity, wherein a sum of target information bit quantities of the S segments is the information bit quantity $K_0$ of the first information bit sequence, and the first redundant bit quantity is obtained by subtracting $K_0$ from a sum of reference information bit quantities of the S segments.

18. The method according to claim 17, wherein the determining the target information bit quantity of each of the S segments based on a reference information bit quantity of each of the S segments and a first redundant bit quantity comprises:
determining that a target information bit quantity of the $i^{th}$ segment in the S segments is obtained by subtracting the first redundant bit quantity from a parameter information bit quantity of the $i^{th}$ segment, wherein a target information bit quantity of a second segment other than the $i^{th}$ segment in the S segments is a parameter information bit quantity of the second segment, and $1 \leq i \leq S$.

19. The method according to claim 18, wherein a value of i is S.

20. The method according to claim 17, wherein the largest segment code length of the S segments is $2^r$, and a quantity of segments having the segment code length of $2^r$ in the S segments is $M_r$, and $a \leq r \leq b$; and wherein the determining the target information bit quantity of each of the S segments based on a reference information bit quantity of each of the S segments and a first redundant bit quantity comprises:
determining that a target information bit quantity of the segment having the segment code length of $2^r$ in the S segments is a parameter information bit quantity of the segment having the segment code length of $2^r$;
allocating the first redundant bit quantity to target information bit quantities of $S-M_r$ segments having segment code lengths less than $2^b$ in the S segments; and
determining that a target information bit quantity of a second segment in the $S-M_r$ segments having the segment code lengths less than $2^b$ is obtained by subtracting an allocated redundant information bit quantity from a parameter information bit quantity of the second segment.

* * * * *